United States Patent
Ohsawa et al.

(10) Patent No.: US 9,698,340 B2
(45) Date of Patent: Jul. 4, 2017

(54) MAGNETIC MEMORY ELEMENT AND MAGNETIC MEMORY

(71) Applicant: Kabushiki Kaisha Toshiba, Minato-ku (JP)

(72) Inventors: Yuichi Ohsawa, Yokohama (JP); Naoharu Shimomura, Tokyo (JP); Satoshi Shirotori, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/066,137

(22) Filed: Mar. 10, 2016

(65) Prior Publication Data

US 2016/0276574 A1 Sep. 22, 2016

(30) Foreign Application Priority Data

Mar. 17, 2015 (JP) ................. 2015-053903

(51) Int. Cl.
*H01L 29/82* (2006.01)
*H01L 43/08* (2006.01)
(Continued)

(52) U.S. Cl.
CPC ............ *H01L 43/08* (2013.01); *G11C 11/161* (2013.01); *G11C 11/1653* (2013.01);
(Continued)

(58) Field of Classification Search
CPC .............. G11C 11/161; G11C 11/1659; G11C 11/1673; G11C 11/1653; G11C 11/1675;
(Continued)

(56) References Cited

U.S. PATENT DOCUMENTS

2006/0227466 A1 10/2006 Yagami
2008/0180991 A1 7/2008 Wang
(Continued)

FOREIGN PATENT DOCUMENTS

JP 2005-183579 A 7/2005
JP 2006-269885 A 10/2006
(Continued)

OTHER PUBLICATIONS

T. Maruyama, et al., "Large voltage-induced magnetic anisotropy change in a few atomic layers of iron" Nature Nanotechnology, vol. 4, Mar. 2009, pp. 158-161.
(Continued)

*Primary Examiner* — Trung Q Dang
*Assistant Examiner* — Wasiul Haider
(74) *Attorney, Agent, or Firm* — Oblon, McClelland, Maier & Neustadt, L.L.P.

(57) ABSTRACT

According to one embodiment, a magnetic memory element includes a first magnetic layer, a second magnetic layer, a nonmagnetic layer disposed between the first magnetic layer and the second magnetic layer, an electrode disposed on a side surface of the first magnetic layer, and a first insulation layer disposed between the first magnetic layer and the electrode, and including a first region with a first film thickness and a second region with a second film thickness which is less than the first film thickness.

8 Claims, 18 Drawing Sheets

(51) Int. Cl.
  *G11C 11/16* (2006.01)
  *G11C 11/18* (2006.01)
  *H01L 27/22* (2006.01)
  *H01L 43/12* (2006.01)

(52) U.S. Cl.
  CPC ...... *G11C 11/1659* (2013.01); *G11C 11/1673* (2013.01); *G11C 11/1675* (2013.01); *G11C 11/18* (2013.01); *H01L 27/222* (2013.01); *H01L 43/12* (2013.01)

(58) Field of Classification Search
  CPC ....... G11C 11/18; H01L 43/08; H01L 27/222; H01L 43/12
  See application file for complete search history.

(56) References Cited

U.S. PATENT DOCUMENTS

| | | |
|---|---|---|
| 2010/0315863 A1 | 12/2010 | Zhu et al. |
| 2011/0233697 A1* | 9/2011 | Kajiyama ............... G11C 11/16 257/421 |
| 2012/0069647 A1 | 3/2012 | Kramer et al. |
| 2014/0070162 A1* | 3/2014 | Iwayama ............... H01L 43/08 257/4 |
| 2014/0210025 A1 | 7/2014 | Guo |
| 2014/0269038 A1 | 9/2014 | Shimomura et al. |

FOREIGN PATENT DOCUMENTS

| | | |
|---|---|---|
| JP | 2014-53546 A | 3/2014 |
| JP | 2014-140068 A | 7/2014 |
| JP | 2014-179425 A | 9/2014 |

OTHER PUBLICATIONS

S. Kanai, et al., "Electric field-induced magnetization reversal in a perpendicular-anisotropy CoFeB—MgO magnetic tunnel junction" Applied Physics Letters, vol. 101, 2012, pp. 122403-1-122403-3 and Cover Page.

F. Bonnell, et al., "Large change in perpendicular magnetic anisotropy induced by an electric field in FePd ultrathin films" Applied Physics Letters, vol. 98, 2011, pp. 232510-1-232510-3 and Cover Page.

* cited by examiner

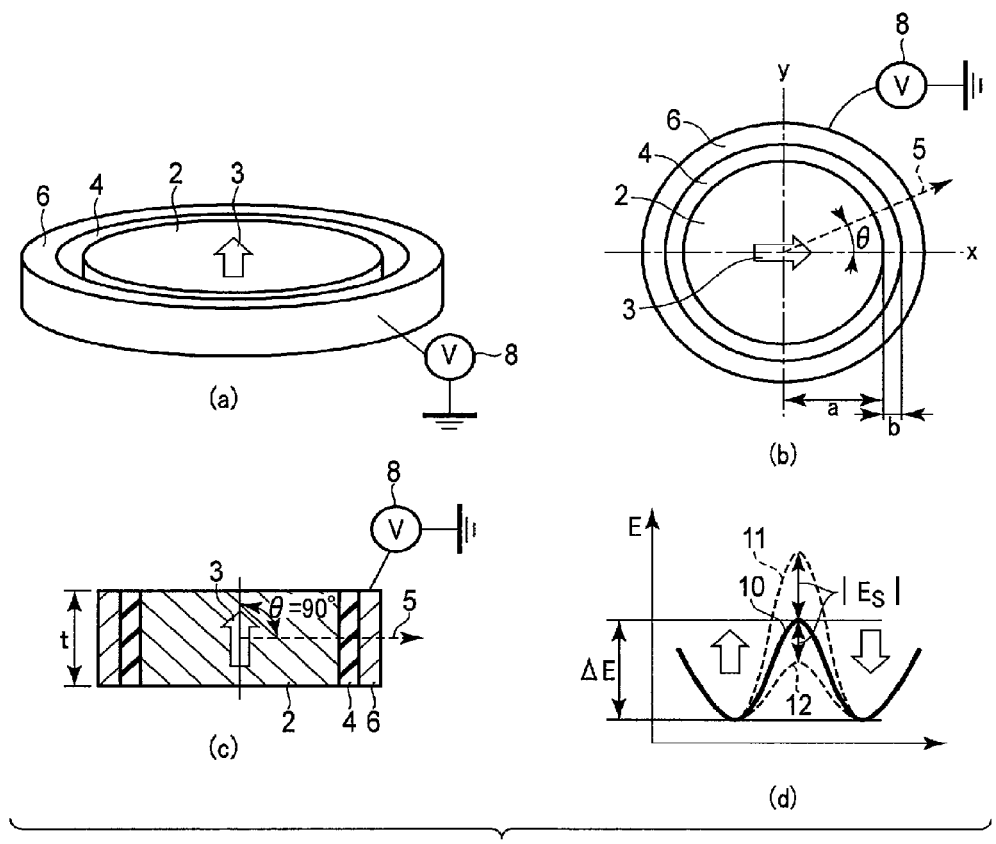
F I G. 1

H:High electric field region

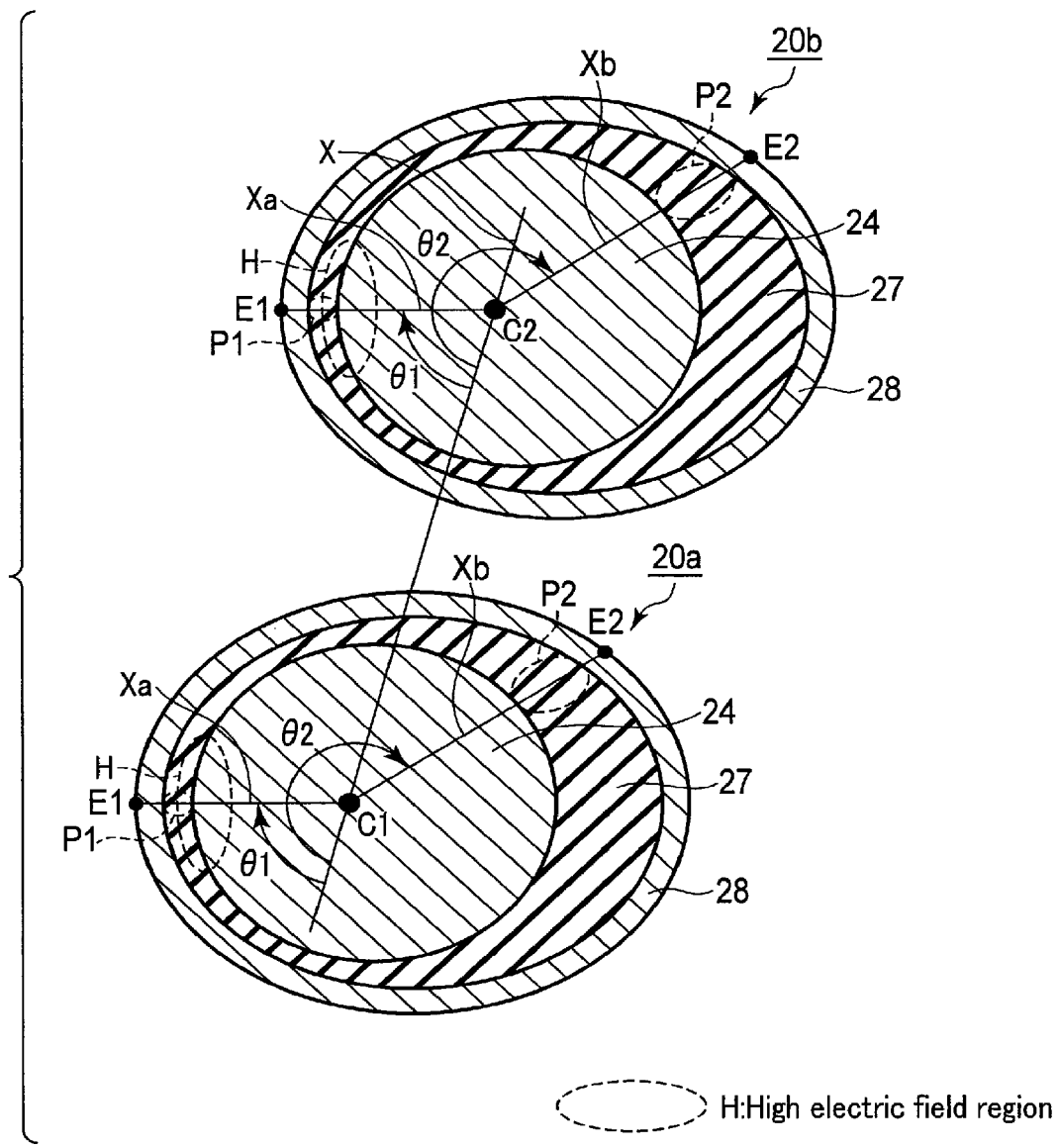
F I G. 10

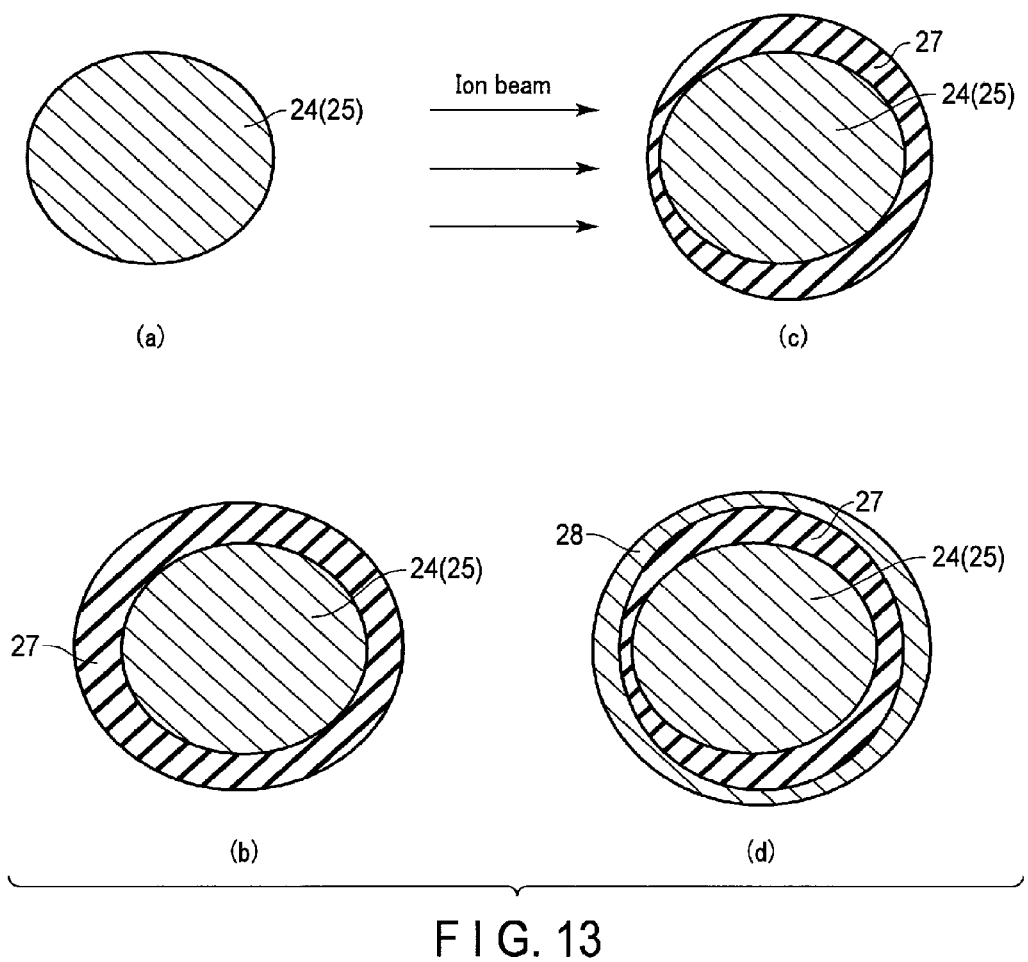
F I G. 13

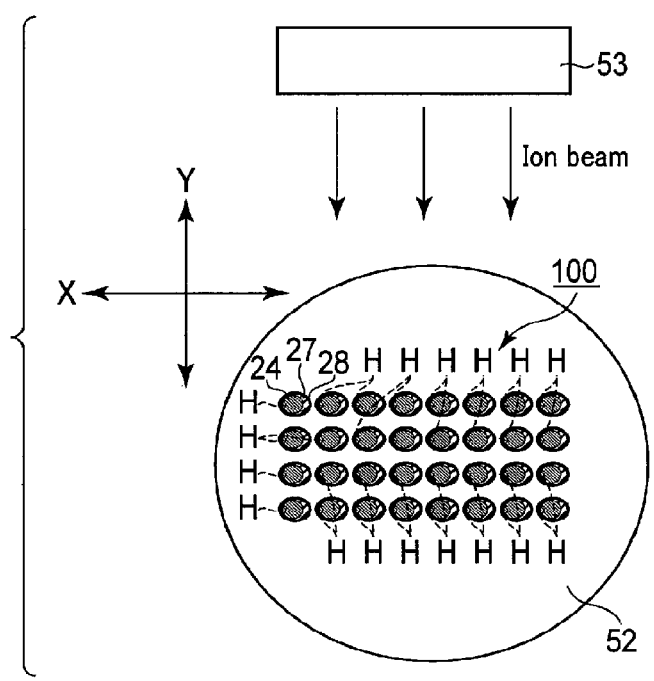
F I G. 15

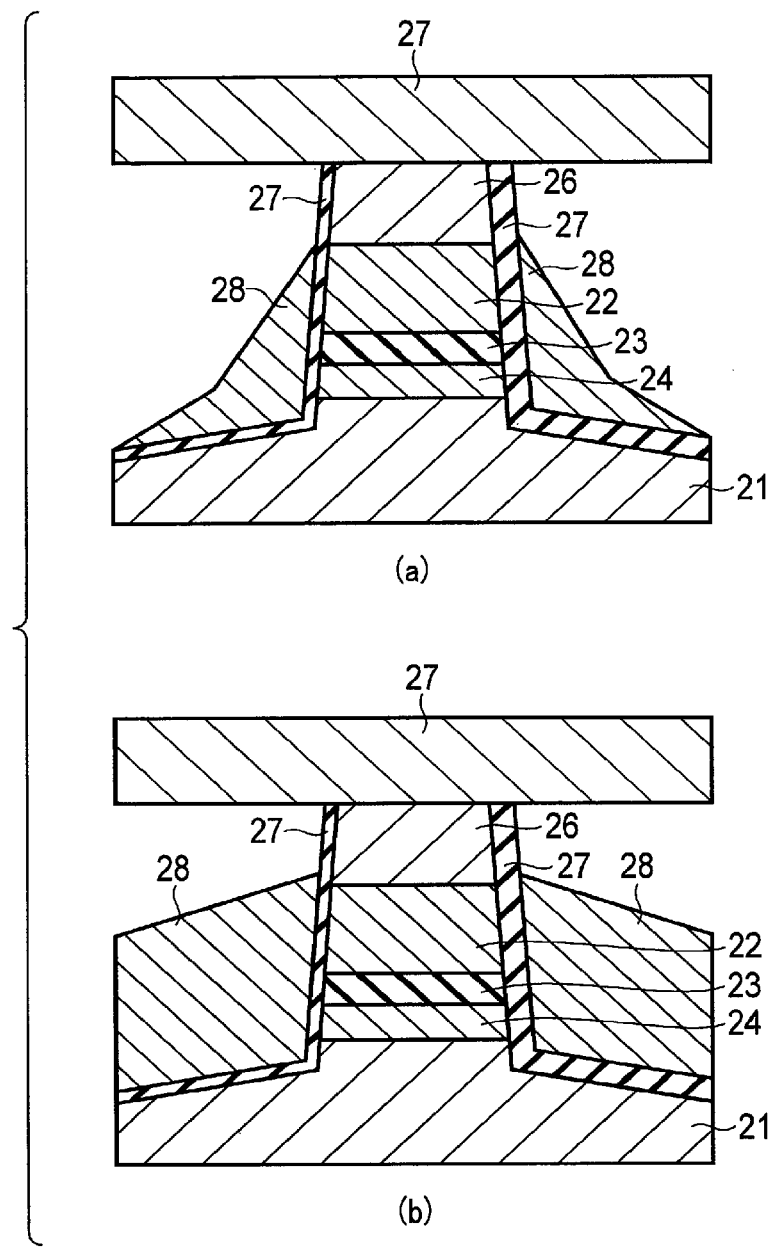
F I G. 16

| | | | BL⟨t⟩ | BL⟨t+1⟩ | EL⟨s⟩ | EL⟨s+1⟩ |
|---|---|---|---|---|---|---|
| First case | Case in which potential of memory layer is stabilized under condition of (potential of control electrode > potential of memory layer) | Write | 0.5V | 0V | ≦0.5V | 1.5V |
| | | Read | 0.3V | 0V | 1.5V | 1.5V |
| Second case | Case in which potential of memory layer is stabilized under condition of (potential of control electrode < potential of memory layer) | Write | 0.5V | 1.5V | ≧0.5V | 0V |
| | | Read | 0.3V | 1.5V | 0V | 0V |

MAGNETIC MEMORY ELEMENT AND MAGNETIC MEMORY

CROSS-REFERENCE TO RELATED APPLICATIONS

This application is based upon and claims the benefit of priority from the prior Japanese Patent Application No. 2015-053903, filed Mar. 17, 2015, the entire contents of which are incorporated herein by reference.

FIELD

Embodiments described herein relate generally to a magnetic memory element and a magnetic memory.

BACKGROUND

An MRAM (Magnetoresistive Random Access Memory) is a magnetic memory which utilizes the reversal of magnetization. A spin-transfer MRAM, which uses write by spin transfer, is excellent in high speed performance, high integration density, and durability, and is prospective as a general-purpose nonvolatile random access memory.

In the spin-transfer MRAM, an MTJ (Magnetic Tunnel Junction) element is used as a memory element. This MTJ element includes a storage layer including a magnetic layer, the direction of magnetization of which is variable by a write operation of the memory; a reference layer including a magnetic layer, the direction of magnetization of which is fixed in one direction; and a tunnel barrier layer which is interposed between the storage layer and the reference layer and forms a tunnel barrier. Depending on whether the magnetization of the storage layer and the magnetization of the reference layer are in a parallel state or in an antiparallel state, the electrical resistance in a case of causing an electric current to flow in a direction perpendicular to the film surface of the MTJ element takes a low resistance state or a high resistance state. By using a difference in resistance between the parallel state and the antiparallel state, data (information) can be read from the MTJ element.

In the write by spin transfer, the magnetization of the storage layer is reversed by causing an electric current to flow in a direction perpendicular to the film surface of the MTJ element. For example, when the magnetization is reversed from the antiparallel state to parallel state, an electric current is caused to flow in such a direction that electrons flow from the reference layer to the storage layer. The direction of the electric current becomes, conversely, a direction from the storage layer toward the reference layer. By this current flow, a spin torque acts on the magnetization of the storage layer such that the magnetization of the storage layer becomes parallel to the magnetization of the reference layer, and the magnetization of the storage layer can be reversed by causing a current of a predetermined threshold or more to flow. On the other hand, when the magnetization is reversed from the parallel state to antiparallel state, an electric current is caused to flow in such a direction that electrons flow from the storage layer to the reference layer. By this current flow, a spin torque acts on the magnetization of the storage layer such that the magnetization of the storage layer becomes antiparallel to the magnetization of the reference layer. In this manner, by changing the direction of the electric current that is caused to flow, data rewrite is enabled.

In the MRAM using spin-transfer writing, an electric current is applied to the MTJ element through the same path at a time of read and at a time of write. Thus, there is, potentially, a risk of read disturb by which data is rewritten at a time of read. In order to avoid this risk, there is a method of setting a read current, which is supplied to the MTJ element at a time of read, to be lower than a write current which is supplied to the MTJ element at a time of write. By this technique, the probability of occurrence of read disturb is reduced. However, to decrease a read current causes a decrease in read sensitivity. Thus, there is a lower limit to a practical read current.

This being the case, in order to avoid the occurrence of read disturb, such a method has been proposed that the probability of occurrence of read disturb is reduced by setting the pulse width of a read current to be smaller than the pulse width of a write current. However, in a memory which requires a high speed operation, the pulse width of a write current becomes smaller due to the demand for an increase in speed of the write operation. It is thus necessary to make smaller the pulse width of the read current, but there is also a lower limit to the pulse width of the read current, because of problems of read sensitivity and wiring delay of current pulses.

Furthermore, it has been reported that the write current increases if the pulse width of the pulse of the write current is decreased in order to meet a demand for an increase in speed at a time of write. Thus, as regards the reduction in write power, that is, power saving, an importance is placed on the reduction in write current.

BRIEF DESCRIPTION OF THE DRAWINGS

FIG. 1 is a view for explaining the principle of suppression of an energy barrier that is necessary for magnetization reversal, by applying a voltage to a side surface of a magnetic layer having magnetization perpendicular to a film surface;

FIG. 10 is a view for explaining a disposition of a high electric field region in the memory cell array of the magnetic memory according to the third embodiment;

FIG. 13 is a view for describing a forming method (2) of the side-wall insulation film of the MTJ element according to the third embodiment;

FIG. 15 is a view for describing the forming method (2) of the side-wall insulation film of the MTJ element according to the third embodiment;

FIG. 16 is a view for describing a control electrode of an MTJ element according to a fourth embodiment;

DETAILED DESCRIPTION

Figure 2:
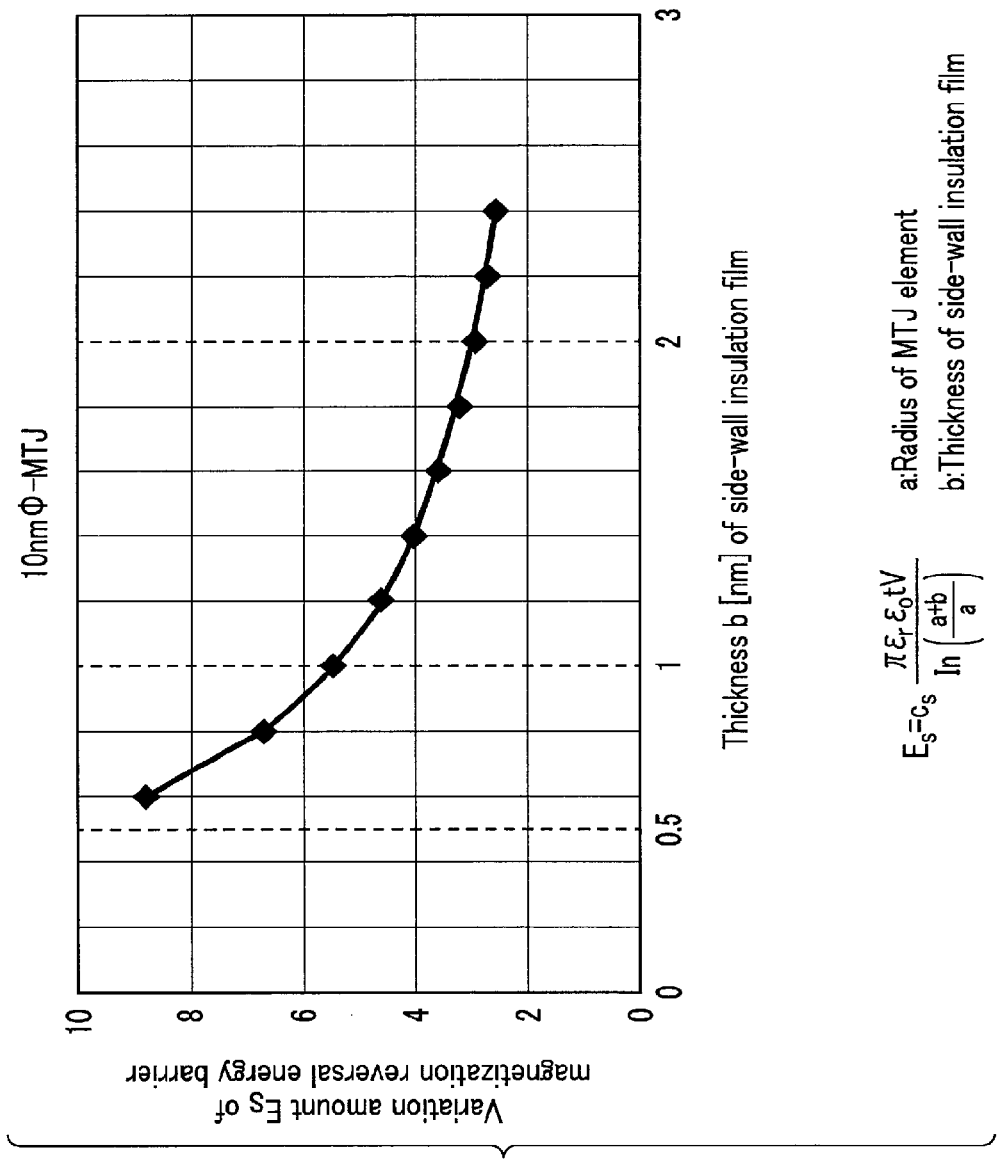
FIG. 2 is a view illustrating a relationship between a film thickness of a side-wall insulation film and a variation amount of a magnetization reversal energy barrier.

In general, according to one embodiment, a magnetic memory element includes a first magnetic layer, a second magnetic layer, a nonmagnetic layer disposed between the first magnetic layer and the second magnetic layer, an electrode disposed on a side surface of the first magnetic layer, and a first insulation layer disposed between the first magnetic layer and the electrode, and including a first region with a first film thickness and a second region with a second film thickness which is less than the first film thickness.

Various embodiments will be described hereinafter with reference to the accompanying drawings. In the description below, common parts are denoted by like reference numerals throughout the drawings.

[1] Principle

Such a phenomenon is known that, in a structure in which top and bottom electrodes are disposed on the upper and lower parts of a multilayer structure of a magnetic layer and an insulation film, if a voltage is applied to these top and bottom electrodes, magnetic anisotropy energy in the direction of the voltage application varies. This phenomenon occurs by an interaction between an electric charge, which is induced near an interface between the magnetic layer and insulation film, and spin-polarized electrons of the magnetic layer.

The inventors first discovered that, in a structure in which an electrode is disposed, with an insulation film interposed, on a side surface of a magnetic layer whose magnetization is perpendicular to a film surface, an energy barrier of magnetization reversal can be controlled with high efficiency by applying a voltage between the magnetic layer and the electrode. Here, the "film surface" refers to an upper surface of the magnetic layer. This principle will be explained with reference to part (a) of FIG. 1 to part (d) of FIG. 1.

Part (a) of FIG. 1 illustrates a simplified model for explaining the principle. As illustrated in part (a) of FIG. 1, this model includes a discoidal magnetic layer 2; an insulation film 4 surrounding a side surface of the magnetic layer 2; and a control electrode 6 disposed on a side opposite to the magnetic layer 2, with the insulation film 4 being interposed. The magnetic layer 2 is a layer simulating the storage layer of an MTJ element (magnetic memory element). A voltage is applied between the control electrode 6 and magnetic layer 2. For example, a power supply 8 is connected to the control electrode 8, and the potential of the magnetic layer 2 is fixed at zero potential. It is assumed that magnetization 3 of the magnetic layer 2 is a macro-spin model in which all magnetization directions are identical.

Part (b) of FIG. 1 is a horizontal cross section of the model illustrated in part (a) of FIG. 1, and illustrates a case in which the magnetization 3 is in a direction within the film surface (hereinafter, also referred to as "in-plane direction"). Since the axis of easy magnetization of the magnetic layer 2 is a direction perpendicular to the film surface, the magnetization 3 of part (b) of FIG. 1 indicates a state in which the magnetization 3 is in a direction of the axis of hard magnetization. However, since the shape of the magnetic layer 2 is discoidal, if the magnetization 3 is in the in-plane direction, the magnetization 3 is equivalent in terms of energy in any of directions within the plane.

As illustrated in part (b) of FIG. 1, the center of the disc is set to be the origin, an x axis and a y axis are disposed within the film surface, and the direction of the magnetization 3 is set to be an x axis. If a voltage is applied between the control electrode 6 and magnetic layer 2, an electric charge is induced at an interface between the insulation film 4 and magnetic layer 2 in accordance with the applied voltage, and magnetic anisotropy energy in a perpendicular direction to the interface varies.

For example, in a multilayer structure including an insulation film, which includes MgO, and a magnetic layer which includes Fe and whose magnetization is in the in-plane direction, if a negative voltage is applied to the electrode that is disposed on the side opposite to magnetic layer with respect to the insulation film, the magnetic anisotropy energy in the direction perpendicular to the interface increases and a more stable state occurs in the direction perpendicular to the interface. In addition, if a positive voltage is applied to the above-described electrode, the magnetic anisotropy energy in the direction perpendicular to the interface decreases and a more stable state occurs in the direction parallel to the interface, i.e. the direction perpendicular to the normal of the interface.

It is known that, also in a MTJ element having a multilayer structure with a perpendicular magnetic anisotropy including CoFeB, MgO and CoFeB, the magnetic anisotropy energy varies by similarly applying voltages. Specifically, the perpendicular magnetic anisotropy energy of the storage layer decreases by applying a negative voltage to the electrode disposed on the storage layer side with respect to a tunnel barrier layer formed of MgO, and applying a positive voltage to the electrode disposed on the reference layer side. In addition, the perpendicular magnetic anisotropy energy of the storage layer increases by applying a positive voltage to the electrode disposed on the storage layer side, and applying a negative voltage to the electrode disposed on the reference layer side.

It is also known that, in a multilayer film of a magnetic layer and an insulation layer, the magnetic anisotropy energy in the direction perpendicular to the interface increases by applying a positive voltage to the electrode disposed on the insulation layer side. For example, consideration is now given to the case in which a voltage was applied to a multilayer film (MgO/FePd) of a magnetic layer which includes FePd of an $L1_0$ structure with magnetization perpendicular to the film surface, and an insulation layer formed of MgO. If a positive voltage is applied to the electrode disposed on the side of the insulation layer of MgO in relation to the electrode disposed on the side of the magnetic layer of FePd, the perpendicular magnetic anisotropy energy increases, and, conversely, if a negative voltage is applied, the perpendicular magnetic anisotropy energy decreases.

In the model illustrated in part (a) of FIG. 1, the insulation film 4 is disposed in a manner to cover the side surface of the magnetic layer 2. Thus, a variation amount of magnetic anisotropy energy of the entirety of the magnetic layer 2 can be calculated by integrating the variation amounts of magnetic anisotropy energy in minute regions of respective points of the interface between the magnetic layer 2 and insulation film 4 with respect to the entire side surface of the magnetic layer 2.

It is now assumed that the variation amount of magnetic anisotropy energy per unit area of the interface, in a case in which the direction of magnetization is perpendicular to the interface, is $K_s$. As illustrated in part (b) of FIG. 1, an angle formed between a normal vector 5 of the interface and the direction of magnetization is θ at a point in a direction of azimuth angle θ to the direction of magnetization (x-axis direction). Thus, a variation amount $\delta E_s$ of magnetic anisotropy energy due to an electric field, which is applied to the minute region of the interface at this point, is expressed by $$\delta E_s = K_s \cos^2 \theta \delta S \qquad (1)$$

where δS is an area of the minute region of the interface.

As indicated by the following equation (2), by integrating this energy variation amount $\delta E_s$, a variation amount $E_s$ of magnetic anisotropy energy due to an applied voltage is obtained.

$$E_S = \frac{1}{2} K_s S \qquad (2)$$

where S is an area of the entire interface.

On the other hand, part (c) of FIG. 1 illustrates a state in which the magnetization of the magnetic layer 2 of the model is directed in a perpendicular direction which is an easy axis. In this case, since the angle θ formed by the normal vector 5 and magnetization 3 is a right angle, the value of equation (1) becomes zero at all points of the interface. Thus, the variation amount $E_s$ of magnetic anisotropy energy, which was integrated by the entirety of the interface, also becomes zero.

Part (d) of FIG. 1 is a view in which the potential energy of the magnetic layer 2 is schematically plotted relative to the direction of magnetization. Two states, in which the potential energy takes a minimum value, represent states in which the magnetization 3 is perpendicular to the film surface and is set in the upward and downward directions. A state, in which the potential energy takes a maximum value, represents a state in which the magnetization 3 is set in the direction of the film surface. The energy barrier of magnetization reversal becomes a difference between these potential energies.

A solid line 10 indicates a potential energy in a case in which the potential of the control electrode 6 is equal to that of the magnetic layer 2, and an energy barrier that is necessary for reversal under this condition is indicated by ΔE. On the other hand, a chain line 11 and a chain line 12 indicate potential energies in states in which a voltage is applied between the magnetic layer 2 and control electrode 6.

When the variation amount $E_s$ of magnetic anisotropy energy due to an applied voltage is positive, the maximum state of potential, in which the magnetization is set in the in-plane direction, becomes more stable than in the case in which no voltage is applied. Thus, as indicated by the chain line 12, the maximum value of potential energy decreases by $|E_s|$. Conversely, when the variation amount $E_s$ is negative, the maximum state of potential becomes unstable. Thus, as indicated by the chain line 11, the maximum value of potential energy increases by $|E_s|$. By applying the voltage in this manner, the maximum value of potential energy varies by $|E_s|$.

On the other hand, as described with reference to part (c) of FIG. 1, the minimum value of potential energy does not vary by the application of a voltage. As a result, by applying a voltage to the interface, the energy barrier ΔE of magnetization reversal varies. When a voltage was applied with such a polarity that the perpendicular magnetic anisotropy energy at the interface between the magnetic layer 2 and insulation film 4 increases, ΔE decreases. When a voltage was applied with such a polarity that the perpendicular magnetic anisotropy energy at the interface decreases, ΔE increases. The absolute value of this variation amount becomes equal to the value given by equation (2).

In the meantime, as is understood from part (d) of FIG. 1, that the energy barrier ΔE of magnetization reversal of the storage layer increases means that the magnetization of the storage layer becomes difficult to be reversed. Thus, this energy barrier ΔE can be restated as memory retention energy.

In addition, there is a case in which, when rearrangement of an occupation state of an electron orbit, which contributes to spin polarization, is induced by the application of a voltage, the magnetic anisotropy in the direction perpendicular to the film surface can be directly controlled also by the voltage application to the side wall, in accordance with the dependency of the occupation ratio of electrons which occupy each electron orbit. In this case, it is possible to directly control not only the interface magnetic anisotropy, but also the perpendicular magnetic anisotropy of a material having a high magnetocrystalline anisotropy.

Next, a description is given of an estimation calculation result of the variation ratio of perpendicular magnetic anisotropy energy by the application of a voltage to the side surface of the storage layer of the MTJ element, with respect to the simplified model.

As illustrated in part (b) of FIG. 1, it is assumed that the radius of the magnetic layer 2 is a, and the thickness of the insulation film 4 between the magnetic layer 2 and control electrode 6 is b. As illustrated in part (c) of FIG. 1, it is assumed that the thickness of the magnetic layer 2 is t. In this structure, an electrostatic capacitance C of a cylindrical capacitor, which is constituted by the magnetic layer 2, insulation film 4 and control electrode 6, is expressed by the following equation (3).

$$C = \frac{2\pi \varepsilon_r \varepsilon_0 t}{\ln\left(\frac{a+b}{a}\right)} \qquad (3)$$

where $\varepsilon_0 = 8.85 \times 10^{-12}$ (F/m) is a dielectric constant of vacuum, and $\varepsilon_r$ is a dielectric constant of the insulation film 4. From equation (3), a surface accumulated charge amount Q, which occurs by applying a voltage V (V) between the magnetic layer 2 and electrode 6, is given by the following equation (4).

$$Q = CV = \frac{2\pi\varepsilon_r\varepsilon_0 t}{\ln\left(\frac{a+b}{a}\right)} \quad (4)$$

In addition, the surface area, on which charge accumulation occurs, is $S=2\pi at$.

A variation amount $K_s$ of magnetic anisotropy energy per unit area of the interface is proportional to a charge amount occurring per unit area of the interface, as indicated by equation (5).

$$K_s = c_s \frac{Q}{S} \quad (5)$$

Using equation (2), equation (4) and equation (5), a variation amount $E_s$ of the magnetization reversal energy barrier by the application of a voltage to the interface is given by the following equation (6).

$$E_s = c_s \frac{\pi\varepsilon_r\varepsilon_0 tV}{\ln\left(\frac{a+b}{a}\right)} \quad (6)$$

Accordingly, in order to improve the efficiency of the variation of magnetic anisotropy energy, it should suffice if the dielectric constant $\in_r$ of the insulation film 4 is increased by using the magnetic layer 2 of a material with a large constant of proportionality $C_s$, and the insulation film 4 with a high dielectric constant which forms an interface with this magnetic layer 2.

In addition, $E_s$ can be increased by decreasing the denominator of equation (6). For example, if a has decreased, the variation of b greatly affects $E_s$ relatively. As illustrated in FIG. 2, it is understood that, in the case of an MTJ element (magnetic layer 2) with a diameter of 10 nm, for instance, the variation of $E_s$ relative to the film thickness b of the side-wall insulation film (insulation film 4) sharply increases from b that is 1 nm or less. In the neighborhood of b=1 nm, $E_s$ can greatly be increased by only slightly decreasing b.

On the other hand, the decrease of b in the neighborhood of b=1 nm causes a decrease in breakdown voltage of the MTJ element. Thus, when the stable operation of the MTJ element is considered, it is desirable not to make thin the side-wall insulation film over the entirety of the peripheral surface of the MTJ element.

[2] MTJ Element

[2-1] Basic Configuration

Figure 3:
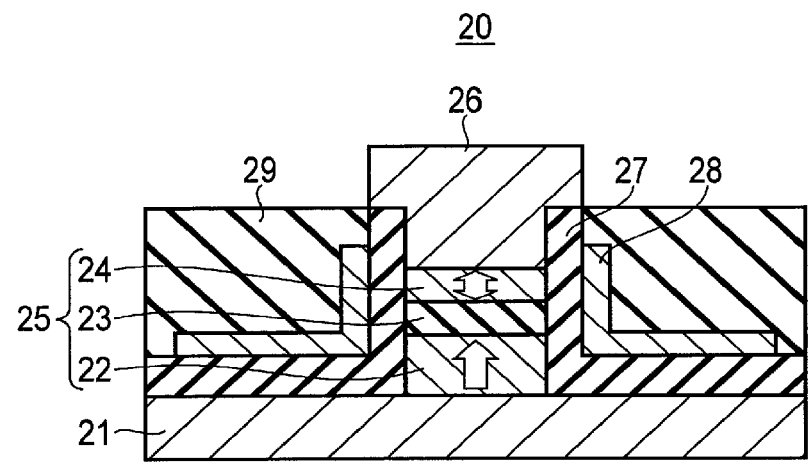
FIG. 3 is a cross-sectional view of an MTJ element according to each of embodiments.
Figure 4:
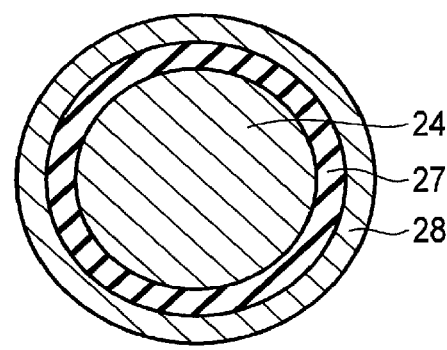
FIG. 4 is a cross-sectional view taken along a plane parallel to a film surface of a storage layer in FIG. 3.

Referring to FIG. 3 and FIG. 4, an MTJ element of a magnetic memory of each of embodiments is described. The magnetic memory of each embodiment includes at least one memory cell, and this memory cell includes an MTJ element as a memory element.

As illustrated in FIG. 3, an MTJ element 20 includes a bottom electrode 21, a magnetic layer 22, a tunnel barrier layer 23, a magnetic layer 24, a top electrode 26, a side-wall insulation film 27, and a control electrode 28. The periphery of the MTJ element 20 is covered with an insulation film 29.

The MTJ element 20 includes a multilayer which includes the magnetic layer 22, tunnel barrier layer 23 and magnetic layer 24. In the multilayer structure 25, the magnetic layer 22 is disposed on the bottom electrode 21, the tunnel barrier layer 23 is disposed on the magnetic layer 22, and the magnetic layer 24 is disposed on the tunnel barrier layer 23.

One of the magnetic layer 22 and magnetic layer 24 is a reference layer in which the direction of magnetization is perpendicular to the film surface and is fixed, and the other is a storage layer in which the direction of magnetization is perpendicular to the film surface and is variable. Here, that the direction of magnetization is fixed means that, when a write current is caused to flow between the bottom electrode 21 and top electrode 26, the direction of magnetization is unchanged before and after the write current is caused to flow. In addition, that the direction of magnetization is variable means that, when a write current is caused to flow between the bottom electrode 21 and top electrode 26, the direction of magnetization is variable before and after the write current is caused to flow. In FIG. 3, the magnetic layer 22 is a reference layer, and the magnetic layer 24 is a storage layer. Thus, in the description below, the magnetic layer 22 is referred to as "fixed layer 22", and the magnetic layer 24 is referred to as "storage layer 24". However, conversely to the case shown in FIG. 3, the magnetic layer 22 may be a storage layer, and the magnetic layer 24 may be a reference layer. Besides, the directions of magnetization of the reference layer 22 and storage layer 24 may be parallel to the film surface.

The film surface shape (plan-view shape) of the multilayer structure 25 may be circular, as illustrated in FIG. 4, or may be an arbitrary shape surrounded by a closed curve.

The bottom electrode 21 is disposed under the fixed layer 22 of the multilayer structure 25. The bottom electrode 21 has a plan-view shape which is different from that of the multilayer structure 25, and has a larger plan-view shape than the multilayer structure 25. However, a part or the entirety of the bottom electrode 21 may have the same plan-view shape as the multilayer structure 25, and may have a side surface which agrees with the side surface of the multilayer structure 25.

The top electrode 26 is disposed on the storage layer 24 of the multilayer structure 25. A lower part of the top electrode 26 has the same plan-view shape as the multilayer structure 25, and has a side surface which agrees with the side surface of the multilayer structure 25. An upper part of the top electrode 26 has a plan-view shape which is different from the plan-view shape of the multilayer structure 25, and has a larger plan-view shape than the multilayer structure 25. However, the entirety of the top electrode 26 may have a plan-view shape which is identical to, or different from, the plan-view shape of the multilayer structure 25.

The side-wall insulation film 27 is disposed on the side surface of the multilayer structure 25, on the side surface of the lower part of the top electrode 26, and on the top surface of the bottom electrode 21. The side-wall insulation film 27 electrically insulates the multilayer structure 25, top electrode 26 and bottom electrode 21 from the control electrode 28. As illustrated in FIG. 4, the side-wall insulation film 27 is disposed in a manner to surround the side surface of the storage layer 24 (multilayer structure 25).

The control electrode 28 is disposed, with the side-wall insulation film 27 interposed, on at least the side surface of the storage layer 24. As illustrated in FIG. 4, the control electrode 28 is disposed in a manner to surround the side surface of the storage layer 24.

[2-2] Materials

As the storage layer 24, use can be made of, for example, a metal and an alloy including a magnetic element selected from among magnetic elements such as iron (Fe), cobalt (Co) and nickel (Ni), a Mn-based alloy such as Mn—Ga or Mn—Ge, or an oxide (ferrite) including at least one of these magnetic elements. As the storage layer 24, use may also be made of a layer formed of a compound or an alloy including rare earth elements, neodymium (Nd), samarium (Sm) and terbium (Tb), and a magnetic element. The storage layer 24 may have a multilayer structure including a first magnetic film, a second magnetic film, and a nonmagnetic film disposed between the first and second magnetic films.

As the reference layer 22, use can be made of, for example, an alloy layer or an ordered alloy layer including at least one element selected from the group consisting of Fe, Co and Ni as magnetic elements, and at least one element selected from the group consisting of Pt, Pd, Ru and Re, a Mn-based alloy such as Mn—Ga or Mn—Ge, or a multi-layer structure in which a plurality of these layers are stacked. The reference layer 22 may have a multilayer structure including a first magnetic film, a second magnetic film, and a nonmagnetic film disposed between the first and second magnetic films. In this case, the first and second magnetic films are magnetically coupled via the nonmagnetic film.

As the tunnel barrier layer 23, for example, a thin film of an oxide, such as MgO or $Al_2O_3$, can be used.

As the side-wall insulation film 27, use can be made of, for example, a layer of one of an oxide, a nitride and a fluoride, each of which includes at least one element selected from the group consisting of silicon (Si), aluminum (Al), magnesium (Mg), hafnium (Hf), cerium (Ce), strontium (Sr), tantalum (Ta) and titanium (Ti). It is desirable to use a dielectric with a high dielectric constant as the side-wall insulation film 27, in order to enhance the efficiency of control of the energy barrier by the application of a voltage.

[2-3] Thickness of Side-Wall Insulation Film

It is desirable to set a thickness b of the side-wall insulation film 27 so as to satisfy both of the following first and second requirements.

As the first requirement, it is desired that a leak current, which occurs due to the voltage applied between the control electrode 28 and multilayer structure 25, be sufficiently lower than a current which is caused to flow between the top electrode 26 and bottom electrode 21 at a time or write or read of the MTJ element 20. Accordingly, in order to meet this first requirement, it is desirable that the thickness b of the side-wall insulation film 27 be large to a certain degree.

As the second requirement, it is desired to enhance the efficiency of control of anisotropy energy of the storage layer 24 by applying a voltage to the control electrode 28, at a time of write or read of the MTJ element 20. Accordingly, in order to meet this second requirement, it is desirable that the thickness b of the side-wall insulation film 27 be small.

Although values, which are desirable in order to satisfy both the first and second requirements, vary depending on the materials of the side-wall insulation film 27, fixed layer 22 and storage layer 24, the thickness of the side-wall insulation film 27 should be set preferably in a range of 0.5 nm to 10 nm, more preferably in a range of 0.5 nm to 3 nm, and still more preferably in a range of 1 nm to 2 nm.

[3] Operations of the Magnetic Memory

Referring to FIG. 3, a description is given of a read operation, a data retention state and a write operation of the magnetic memory of each of the embodiments.

[3-1] Read Operation

When data stored in the MTJ element 20 is read, a read current is caused to flow between the top electrode 26 and bottom electrode 21, and read is executed to determine whether the magnetization of the storage layer 24 of the MTJ element 20 is in a parallel (low resistance) state or in an antiparallel (high resistance) state, relative to the magnetization of the reference layer 22.

Further, when a read current is caused to flow, a voltage is applied between the storage layer 24 and control electrode 28, and the energy barrier in the storage layer 24 is increased, as indicated by the chain line 11 in part (d) of FIG. 1.

The potential of the control electrode 28 is set to be a positive potential relative to the storage layer 24, for example, in the case of using CoFeB with perpendicular magnetization as the material of the storage layer 24, or in the case of the voltage effect of the same polarity as this material, that is, in the case of the storage layer 24 with such characteristics that when a higher potential is applied to the control electrode 28 than to the storage layer 24, the magnetic anisotropy energy in the direction perpendicular to the interface decreases and a more stable state occurs in the direction parallel to the interface, i.e. in the direction perpendicular to the normal of the interface.

On the other hand, the potential of the control electrode 28 is set to be a negative potential relative to the storage layer 24, in the case of using FePd of a $L1_0$ structure as the storage layer 24, or in the case of the voltage effect of the same polarity as this, that is, in the case of the storage layer 24 with such characteristics that when a lower potential is applied to the control electrode 28 than to the storage layer 24, the magnetic anisotropy energy in the direction perpendicular to the interface decreases and a more stable state occurs in the direction parallel to the interface, i.e. in the direction perpendicular to the normal of the interface.

In this manner, when the read current is caused to flow, such a voltage as to increase the energy barrier $\Delta E$ of magnetization reversal in the storage layer 24 is applied between the storage layer 24 and control electrode 28. Thereby, the probability of magnetization reversal of the storage layer 24 by the read current decreases, and the occurrence of read disturb can be prevented.

[3-2] Data Retention State

In a data retention state in which neither write nor read is executed in the MTJ element 20, the potential of the control electrode 28 is set to be substantially equal to the potential of the storage layer 24, for example, such that a potential difference falls within 0.1 V. This setting is realized, for example, by electrically connecting the control electrode 28 and one of the top electrode 26 and bottom electrode 21. In this case, the potential energy of the storage layer 24 is in the state indicated by the solid line 10 in part (d) of FIG. 1. The energy barrier $\Delta E$ in the data retention state needs to be set to become sufficiently large, so that the magnetization of the storage layer 24 may not be reversed due to thermal agitation during a necessary data retention time (e.g. 10 years).

In addition, in the data retention state, as indicated by the chain line 11 in part (d) of FIG. 1, the potential of the control electrode 28 may be set so that the energy barrier $\Delta E$ that is necessary for magnetization reverse may become large. In this case, too, no problem occurs since the data retention time becomes longer.

[3-3] Write Operation

When data is written to the MTJ element 20, a write current is caused to flow between the top electrode 26 and bottom electrode 21, and the magnetization of the storage layer 24 is reversed by spin-transfer writing.

Further, when the write current is caused to flow, the potential of the control electrode 28 is set such that the storage layer 24 and control electrode 28 have substantially equal potentials, for example, such that a potential difference falls within 0.1 V. In this case, the potential energy of magnetization of the storage layer 24 becomes approximately at a level as indicated by the solid line 10 in part (d) of FIG. 1. Thus, the energy barrier $\Delta E$ that is necessary for magnetization reversal becomes less than the value at the time of read, and an increase in current necessary for write can be prevented.

In addition, when the write current is caused to flow, as indicated by the chain line 12 in part (d) of FIG. 1, a voltage may be applied to the control electrode 28 so that the energy barrier $\Delta E$ necessary for magnetization reverse may become small. In this case, the polarity of the voltage becomes opposite to the polarity of the voltage that is applied at the time of read. Specifically, in the case of using CoFeB with perpendicular magnetization as the material of the storage layer 24, or in the case of the storage layer 24 which exhibits the voltage effect of the same polarity as this, the potential of the control electrode 28 is set to a negative potential relative to the storage layer 24. On the other hand, in the case of using FePd of the $L1_0$ structure as the storage layer 24, or in the case of the storage layer 24 which exhibits the voltage effect of the same polarity as this, the potential of the control electrode 28 is set to a positive potential relative to the storage layer 24.

In this manner, when the write current is caused to flow, such a voltage as to decrease the energy barrier $\Delta E$ of magnetization reversal in the storage layer 24 at the time of write is applied between the storage layer 24 and control electrode 28. Thereby, the electric current in the spin-transfer writing can be decreased.

In particular, in this write operation, the write current can be further decreased by locally generating a high electric field application region in the storage layer 24.

[4] First Embodiment

In a first embodiment, in order to locally generate a high electric field application region in the storage layer 24, a region with a small film thickness b is disposed in the insulation film 27.

[4-1] Configuration

Figure 5:
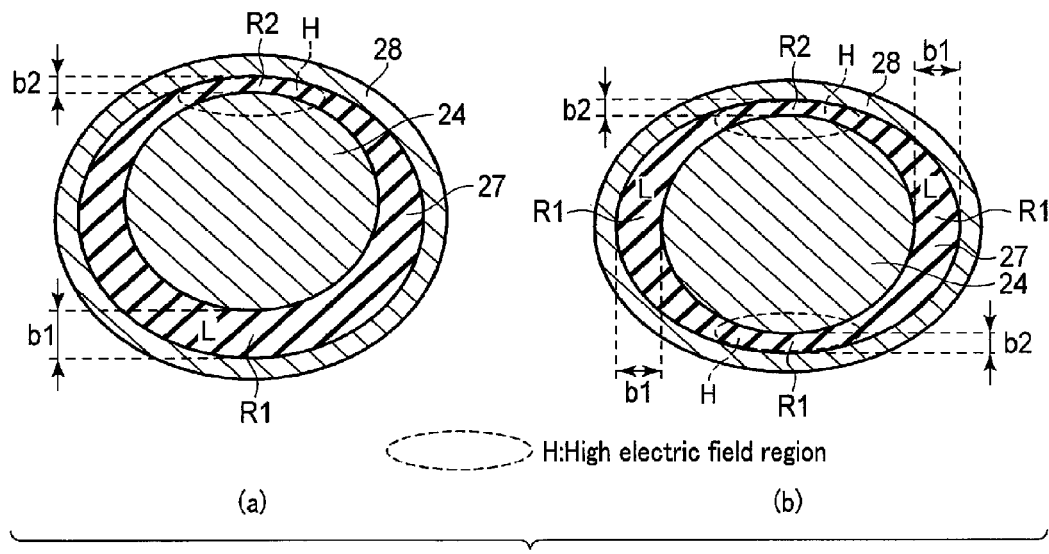
FIG. 5 is a view of a circular MTJ element according to a first embodiment.

Referring to part (a) of FIG. 5 and part (b) of FIG. 5, the configuration of an MTJ element according to the first embodiment is described. Part (a) of FIG. 5 and part (b) of FIG. 5 are cross-sectional plan views of the storage layer 24 in FIG. 3.

As illustrated in part (a) of FIG. 5 and part (b) of FIG. 5, a side-wall insulation film 27 is formed on the periphery of the storage layer 24, and a control electrode 28 is formed on the outside of this side-wall insulation film 27. The side-wall insulation film 27 includes a region R1 with a film thickness b1 which is large, and a region R2 with a film thickness b2 which is small. The thickness b2 of the side-wall insulation film 27 in the region R2 is less than the thickness b1 of the side-wall insulation film 27 in the region R1. Here, when an electric field was generated by applying a voltage between the storage layer 24 and control electrode 28, the electric field intensity in the region R2 becomes higher than the electric field intensity in the region R1. Specifically, by the region R2 where the thickness b2 of the side-wall insulation film 27 is small, a local high electric field region H occurs at an interface between the storage layer 24 and side-wall insulation film 27, when a voltage is applied between the storage layer 24 and control electrode 28.

In part (a) of FIG. 5, since the number of regions R2 where the thickness b2 of the side-wall insulation film 27 is small is one, a single high electric field region H is formed. In part (b) of FIG. 5, since the number of regions R2 where the thickness b2 of the side-wall insulation film 27 is small is two, two high electric field regions H are formed. Incidentally, reference sign "L" in the Figure indicates a region where the electric field is lower than in the high electric field region H and a normal electric field is formed in a case in which no film thickness distribution is imparted to the side-wall insulation film 27.

For example, it is assumed that MgO is used as the side-wall insulation film 27, the thickness b1 of the side-wall insulation film 27 in the region L (region R1) is set at 2 nm, and the thickness b2 of the of the side-wall insulation film 27 in the region H (region R2) is set at 0.9 nm. In this case, as is understood from FIG. 2, the variation amount $E_s$ of the magnetic reversal energy barrier in the region H becomes 6, and the variation amount $E_s$ of the magnetic reversal energy barrier in the region L becomes 3. Thus, in the region H, compared to the region L, the magnetic reversal energy barrier can be reduced to about ½. As a result, the write current can be reduced, contributing to energy saving.

In the meantime, as regards the thickness b of the side-wall insulation film 27, it is desirable that the difference between the maximum value and minimum value be 10% or more. In addition, it is desirable that a maximum value Emax of the intensity of the electric field occurring between the storage layer 24 and control electrode 28 be greater, by 10% or more, than an average value Eave of the intensity of the electric field occurring between the storage layer 24 and control electrode 28.

[4-2] Advantageous Effects

As a comparative example, a case is considered in which a thin side-wall insulation film 27 is disposed over the entire periphery of the storage layer 24 (for example, the thickness b of the entirety of the side-wall insulation film 27 is 0.9 nm). In this case, there was an MTJ element 20 in which the write energy was successfully reduced. However, such an MTJ element 20 was also observed that short-circuit occurred between the control electrode 28 and multilayer structure 25 due to a pinhole or a crystalline defect occurring in the side-wall insulation film 27, and there occurred a decrease in yield.

By contrast, in the first embodiment, the side-wall insulation film 27, which is disposed between the multilayer structure 25 and control electrode 28, has a film thickness distribution along the periphery of the multilayer structure 25. Thus, in the write operation, when a voltage was applied between the storage layer 25 and control electrode 28, the high electric field region H is generated in the region R2 where the thickness b2 of the side-wall insulation film 27 is small. In this high electric field region H, an electric charge is induced at the interface between the side-wall insulation film 27 and storage layer 24, and the magnetic anisotropy energy of the storage layer 24 in the vicinity of this interface can greatly be lowered. Specifically, by locally decreasing the magnetic anisotropy energy of the storage layer 24, a path, which easily causes reversal of magnetization of the storage layer 24, can be formed. As a result, by the spin torque acting on the storage layer 24, which was caused by the write current flowing between the top electrode 26 and bottom electrode 21, the magnetic moment of the storage layer 24, which started a precession, inclines earlier, and the reception of torque becomes easier. Thereby, the time that is needed for magnetization reversal of the storage layer 24 can be shortened. Therefore, the power consumption in the write operation can be reduced.

Figure 6:
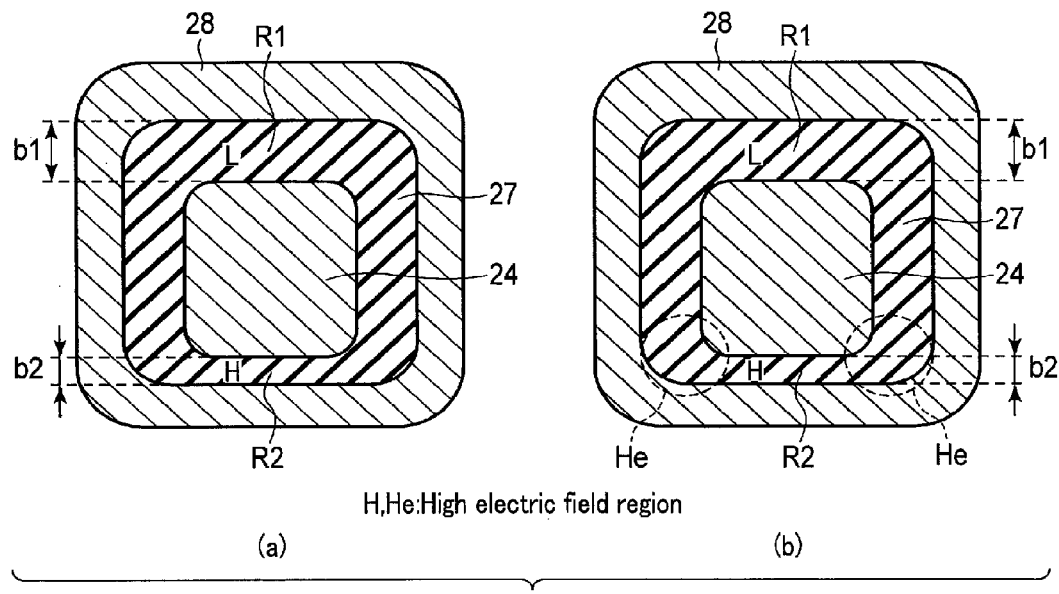
FIG. 6 is a view of a rectangular MTJ element according to the first embodiment.

In the meantime, a rectangular MTJ element 20 as illustrated in part (a) of FIG. 6 and part (b) of FIG. 6 can also realize the reduction in write energy by generating the local high electric field region H. In the case of a rectangular multilayer structure 25, since a side-wall insulation film 27 and a control electrode 28 are formed on the side walls of the multilayer structure 25 in the manufacturing process, the shape of the entirety of the MTJ element 20 is also rectangular. As illustrated in part (a) of FIG. 6 and part (b) of FIG. 6, the side-wall insulation film 27, which includes MgO, includes a region H (b2=0.9 nm) where the film thickness b2 is small, and a region L (b1=2 nm) with a normal film thickness b1. In this case, too, the write power can be reduced, compared to the MTJ element 20 in which the thickness b of the side-wall insulation film 27 is 2 nm over the entirety thereof. In particular, in the case of the rectangular MTJ element 20, as illustrated in part (b) of FIG. 6, regions He with high electric field intensities exist also at corner portions of the side-wall insulation film 27. Thus, in the case of the rectangular MTJ element 20, compared to the circular MTJ element 20, a greater effect of the local high electric field can be obtained.

[5] Second Embodiment

In the first embodiment, the thickness b of the insulation film 27 is partly decreased in order to locally generate the high electric field region H in the storage layer 24. By contrast, in a second embodiment, a plurality of side-wall insulation films with different dielectric constants are used, and the thickness of an insulation film with a high dielectric constant is partly increased, thereby generating a high electric field region H. In the meantime, on the presupposition that the thickness (or the distance between the storage layer 24 and control electrode 28) of the side-wall insulation film 27 is constant, a greater electric field can be applied to the interface of the storage layer 24 as the thickness of the film with a greater dielectric constant becomes larger.

[5-1] Configuration

Figure 7:
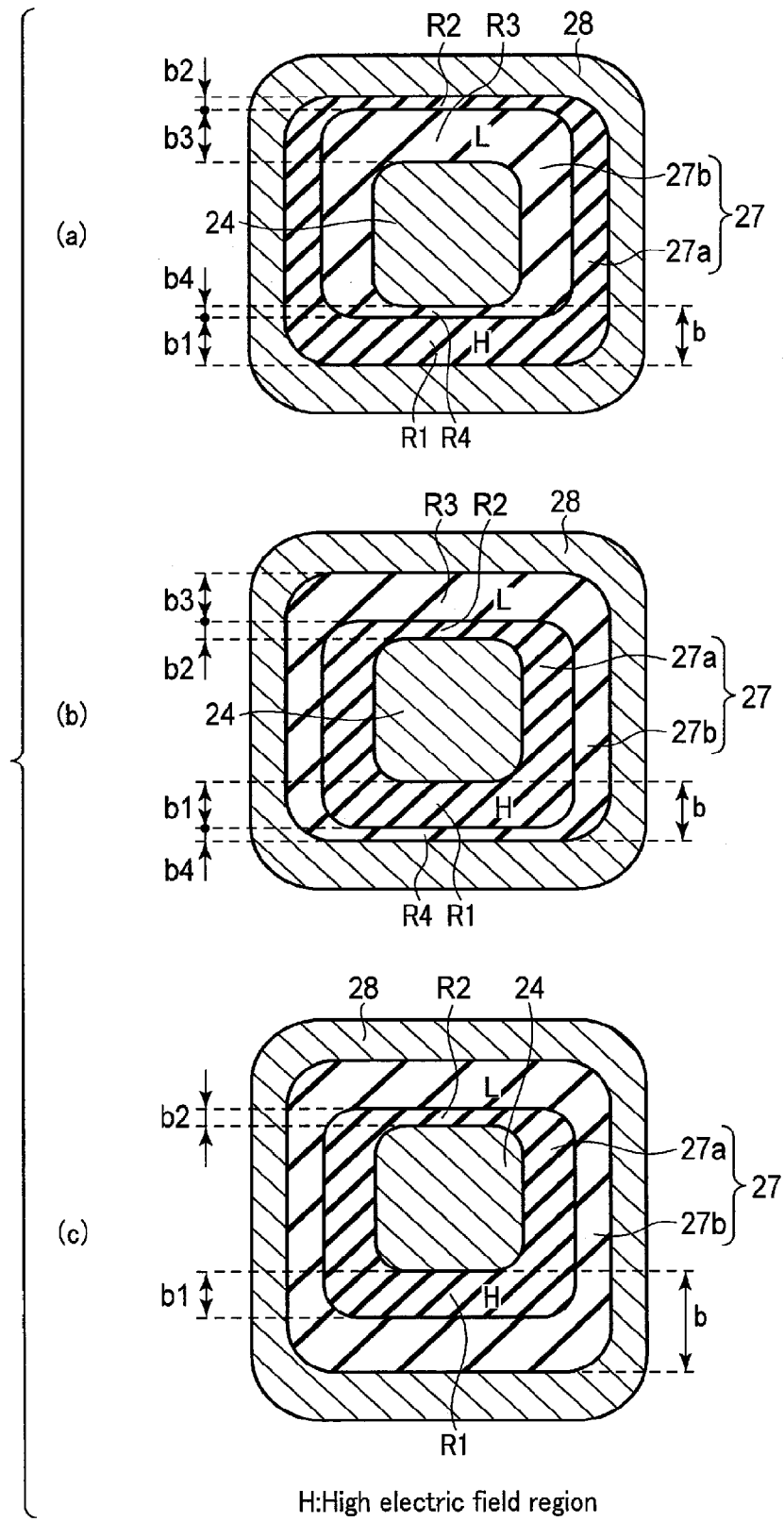
FIG. 7 is a view of a rectangular MTJ element according to a second embodiment.
Figure 8:
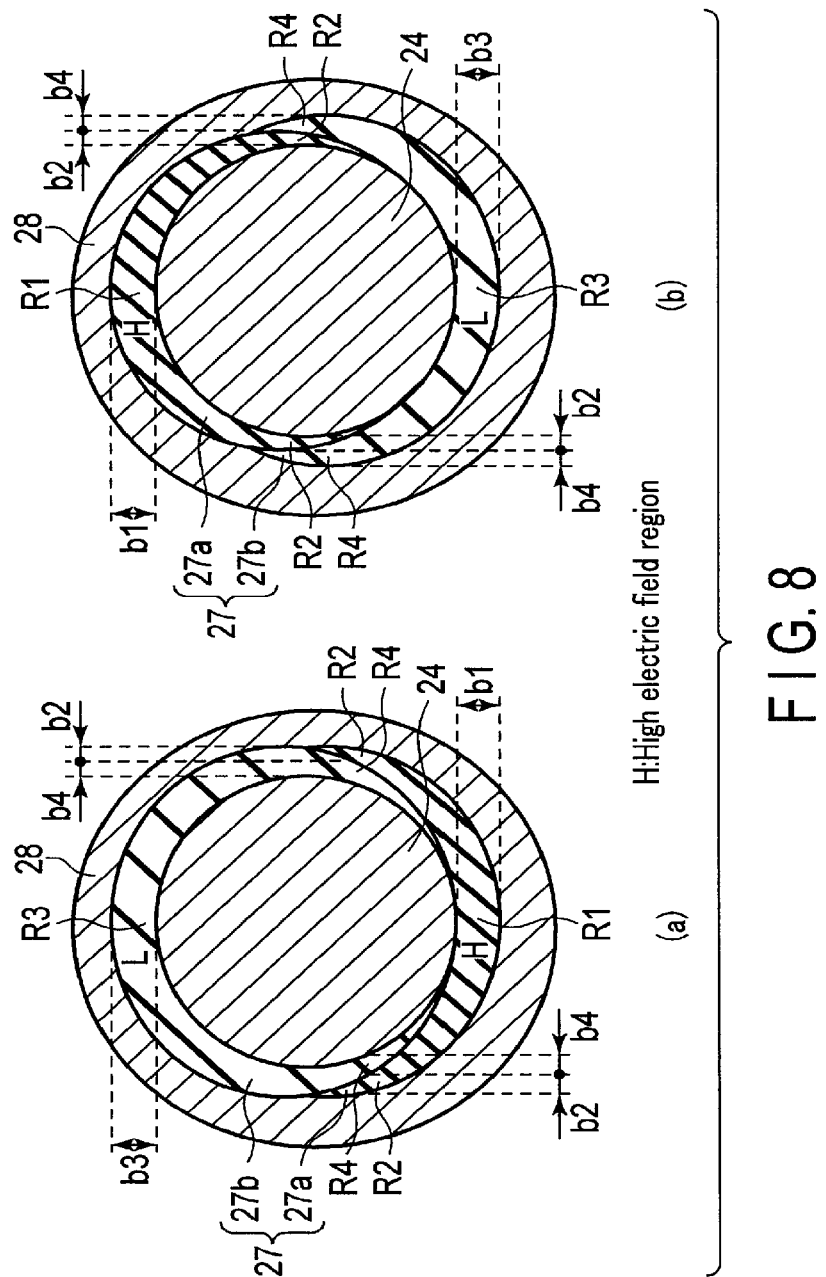
FIG. 8 is a view of a circular MTJ element according to the second embodiment.

Referring to part (a) of FIG. 7 to part (c) of FIG. 7, part (a) FIG. 8, and part (b) of FIG. 8, the configuration of an MTJ element according to the second embodiment is described. Here, although two insulation films are used as the side-wall insulation film 27, three or more insulation films may be used as the side-wall insulation film 27.

As illustrated in part (a) of FIG. 7 to part (c) of FIG. 7, part (a) FIG. 8 and part (b) of FIG. 8, in the second embodiment, the side-wall insulation film 27 includes a first insulation film 27a and a second insulation film 27b. The first insulation film 27a includes a material with a high dielectric constant. The second insulation film 27b includes a material with a dielectric constant which is lower than the dielectric constant of the material of the first insulation film 27a.

On the side surfaces of the storage layer 24, the thickness b of the side-wall insulation film 27 is substantially uniform as a whole, but the ratio between the thickness of the first insulation film 27a and the thickness of the second insulation film 27b is varied. Incidentally, the thickness b of the side-wall insulation film 27 (the sum of the thickness of the first insulation film 27a and the thickness of the second insulation film 27b) is greater than, for example, the thickness of the tunnel barrier layer 23.

In the example of part (a) of FIG. 7 to part (c) of FIG. 7, all side surfaces of the storage layer 24 are surrounded by the two insulation films 27a and 27b.

In the case of part (a) of FIG. 7, in the side-wall insulation film 27 of the two-layer structure, the second insulation film 27b with a low dielectric constant is disposed on the storage layer 24 side, and the first insulation film 27a with a high dielectric constant is disposed on the control electrode 28 side. Thus, the first insulation film 27a with the high dielectric constant is not in direct contact with any one of the side surfaces of the storage layer 24, and the second insulation film 27b with the low dielectric constant is in direct contact with all side surfaces of the storage layer 24.

The first insulation film 27a includes a region R1 with a film thickness b1 which is large, and a region R2 with a film thickness b2 which is small. The thickness b1 of the side-wall insulation film 27 in the region R1 is greater than the thickness b2 of the side-wall insulation film 27 in the region R2. For example, the region R1 is a region including a portion with the largest thickness of the first insulation film 27a, and the region R2 is a region including a portion with the smallest thickness of the first insulation film 27a.

The second insulation film 27b includes a region R3 with a film thickness b3 which is large, and a region R4 with a film thickness b4 which is small. The thickness b3 of the side-wall insulation film 27 in the region R3 is greater than the thickness b4 of the side-wall insulation film 27 in the region R4. For example, the region R3 is a region including a portion with the largest thickness of the second insulation film 27b, and the region R4 is a region including a portion with the smallest thickness of the second insulation film 27b. Here, for example, the region R2 and region R3 are opposed to each other, and the region R1 and region R4 are opposed to each other.

The case of part (b) of FIG. 7 differs from the case of part (a) of FIG. 7 in that, in the side-wall insulation film 27 of the two-layer structure, the first insulation film 27a with the high dielectric constant is disposed on the storage layer 24 side, and the second insulation film 27b with the low dielectric constant is disposed on the control electrode 28 side. Thus, the first insulation film 27a with the high dielectric constant is in direct contact with all side surfaces of the storage layer 24, and the second insulation film 27b with the low dielectric constant is not in direct contact with any one of the side surfaces of the storage layer 24.

The case of part (c) of FIG. 7 differs from the case of part (b) of FIG. 7 in that the thickness of the second insulation film 27b is substantially uniform.

In the examples of part (a) of FIG. 7 to part (c) of FIG. 7, when a voltage is applied between the storage layer 24 and control electrode 28, an electric charge tends to be easily accumulated in the region R1 with the large film thickness of the first insulation film 27a with the high dielectric constant, and a high electric field region H is formed near this region R1.

In the meantime, in the cases of part (a) of FIG. 7 and part (b) of FIG. 7, in the region H, the thickness b1 of the first insulation film 27a is about 2 nm, the thickness b4 of the second insulation film 27b is 0.5 nm or less, and the thickness b of the side-wall insulation film 27 is 2.5 nm or less. On the other hand, in the region L, the thickness b2 of the first insulation film 27a is about 1 nm, the thickness b3 of the second insulation film 27b is about 2 nm, and the thickness b of the side-wall insulation film 27 is about 3 nm.

In examples of part (a) of FIG. 8 and part (b) of FIG. 8, parts of the side surface of the storage layer 24 are surrounded by two insulation films 27a and 27b, but the other parts of the side surface of the storage layer 24 are surrounded by one insulation film 27a or 27b. Thus, the side surface of the storage layer 24 includes a part which is in direct contact with the first insulation film 27a with a high dielectric constant, and a part which is in direct contact with the second insulation film 27b with a low dielectric constant.

In the case of part (a) of FIG. 8, in the part of the side-wall insulation film 27 of the two-layer structure, the second insulation film 27b with the low dielectric constant is disposed on the storage layer 24 side, and the first insulation film 27a with the high dielectric constant is disposed on the control electrode 28 side. Furthermore, a region H of the first insulation film 27a, which is disposed in direct contact with the side surface of the storage layer 24, and a region L of the second insulation film 27b, which is disposed in direct contact with the side surface of the storage layer 24, are formed.

In the case of part (b) of FIG. 8, in the part of the side-wall insulation film 27 of the two-layer structure, the first insulation film 27a with the high dielectric constant is disposed on the storage layer 24 side, and the second insulation film 27b with the low dielectric constant is disposed on the control electrode 28 side. Furthermore, a region H of the first insulation film 27a, which is disposed in direct contact with the side surface of the storage layer 24, and a region L of the second insulation film 27b, which is disposed in direct contact with the side surface of the storage layer 24, are formed.

In the meantime, the MTJ elements 20 of part (a) of FIG. 7 and part (b) of FIG. 7 are of the rectangular type, and the MTJ elements 20 of part (a) of FIG. 8 and part (b) of FIG. 8 are of the circular type. Alternatively, the MTJ elements 20 of part (a) of FIG. 7 and part (b) of FIG. 7 may be of the circular type, and the MTJ elements 20 of part (a) of FIG. 8 and part (b) of FIG. 8 may be of the rectangular type. In addition, a plurality of high electric field regions H may be disposed.

[5-2] Materials

Examples of the material with a high dielectric constant of the first insulation film 27a include perovskite-based materials such as $SrRuO_3$, $SrIrO_3$, $BaTiO_3$, and $StTiO_3$.

Examples of the material with a low dielectric constant of the second insulation film 27b include magnesium oxide, aluminum oxide, aluminum nitride, silicon oxide, and silicon nitride.

In the case of very thin films on the order of nanometers, films of a layer structure tend to become uniform, with these materials of the insulation films 27a and 27b.

In the case of part (a) of FIG. 7, for example, the second insulation film 27b is MgO with a dielectric constant of about 10, and the first insulation film 27a is strontium titanate with a dielectric constant of about 300. Taking into account the movement of oxygen to a magnetic body, MgO that is stable as an oxide is used for the second insulation film 27b that is primitively in contact with the storage layer 24. Thus, a design with a wide margin for a thermal process can be made, and there is a merit in terms of cost.

In the meantime, in the case of an insulation film that comes in direct contact with the storage layer 24, it is desirable to form the insulation film of particles with thermal energy, for example, by MBE (Molecular Beam Epitaxy), vacuum evaporation, ALD (Atomic Layer Deposition), CVD (Chemical Vapor Deposition), etc.

[5-3] Advantageous Effects

In the second embodiment, the insulation films 27a and 27b with different dielectric constants are used as the side-wall insulation film 27. Thus, in the write operation, when a voltage is applied between the storage layer 24 and control electrode 28, an electric charge tends to be easily accumulated in the region with a large thickness of the first insulation film 27a with the high dielectric constant, under the condition that the film thickness of the side-wall insulation film 27 (or the distance between the storage layer 24 and control electrode 28) is constant, and the high electric field region H is locally formed. Thereby, like the first embodiment, the write current can be reduced by locally decreasing the magnetic anisotropy energy of the storage layer 24.

[6] Third Embodiment

In a third embodiment, the arrangement of high electric field regions H in a memory cell array is described.

[6-1] Arrangement of High Electric Field Regions.

Figure 9:
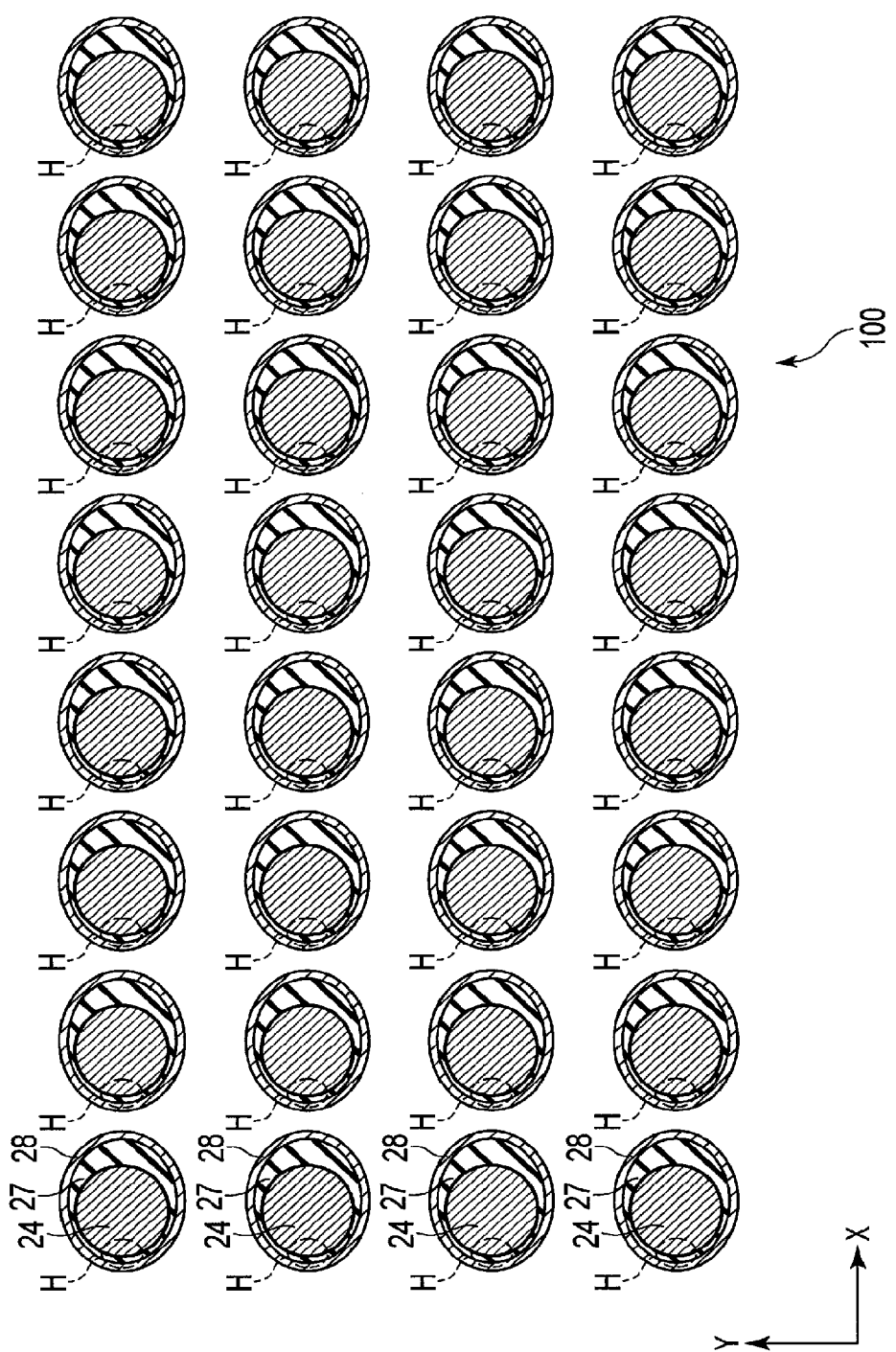
FIG. 9 is a view for explaining a memory cell array of a magnetic memory according to a third embodiment.

Referring to FIG. 9 and FIG. 10, a description is given of the arrangement of high electric field regions H in a memory cell array of a magnetic memory according to the third embodiment.

As is illustrated in FIG. 9, in the magnetic memory, the plural MTJ elements 20 of the first and second embodiment are arranged in an array, and constitute a memory cell array 100. Here, local high electric field regions H are located at relatively identical positions. In FIG. 9, the high electric field regions H are uniformly arranged on the left side of the respective MTJ elements 20 on the sheet surface of FIG. 9.

In the third embodiment, when the MTJ elements 20 of the first embodiment are used, the positions of the thin regions of the side-wall insulation films 27 are uniformly arranged within the memory cell array 100.

In the third embodiment, when the MTJ elements 20 of the second embodiment are used, the positions of the thick regions of the insulation films 27b with the high dielectric constant are uniformly arranged within the memory cell array 100.

As illustrated in FIG. 10, when attention is paid to two MTJ elements 20a and 20b in the memory cell array 100, in the case where an electric field occurs by applying a voltage between the storage layer 24 and control electrode 28, the electric field intensity at a position P1 in the MTJ element 20a is higher than the electric field intensity at a position P2, and the electric field intensity at a position P1 in the MTJ element 20b is higher than the electric field intensity at a position P2. In addition, the film thickness at the position P1 of the side-wall insulation film 27 of the MTJ element 20a is less than the film thickness at the position P2, and the film thickness at the position P1 of the side-wall insulation film 27 of the MTJ element 20b is less than the film thickness at the position P2.

Here, the position P1 in the MTJ element 20a is a position of crossing between the side-wall insulation film 27 and a line segment Xa having a first angle θ1 to a straight line X connecting a center point C1 of the MTJ element 20a and a center point C2 of the MTJ element 20b, the line segment Xa connecting the center point C1 and a first peripheral portion E1 of the MTJ element 20a. In addition, the position P2 in the MTJ element 20a is a position of crossing between the side-wall insulation film 27 and a line segment Xb having a second angle θ2 to the straight line X, which is different from the first angle θ1, and connecting the center point C1 and a second peripheral portion E2 of the MTJ element 20a.

Similarly, the position P1 in the MTJ element 20b is a position of crossing between the side-wall insulation film 27 and a line segment Xa having a first angle θ1 to the straight line X, and connecting the center point C2 and a first peripheral portion E1 of the MTJ element 20b. In addition, the position P2 in the MTJ element 20b is a position of crossing between the side-wall insulation film 27 and a line segment Xb having a second angle θ2 to the straight line X, and connecting the center point C2 and a second peripheral portion E2 of the MTJ element 20b.

The center points C1 and C2 of the MTJ elements 20a and 20b are equivalent to the centers of gravity of the shapes of the MTJ elements 20a and 20b. In addition, the first angle θ1 and second angle θ2 are angles as viewed in the same direction (e.g. clockwise) with reference to the straight line X.

[6-2] Forming Method (1) of the Side-Wall Insulation Film

In a forming method (1) of the side-wall insulation film 27 of the present embodiment, evaporation deposition is used.

Figure 11:
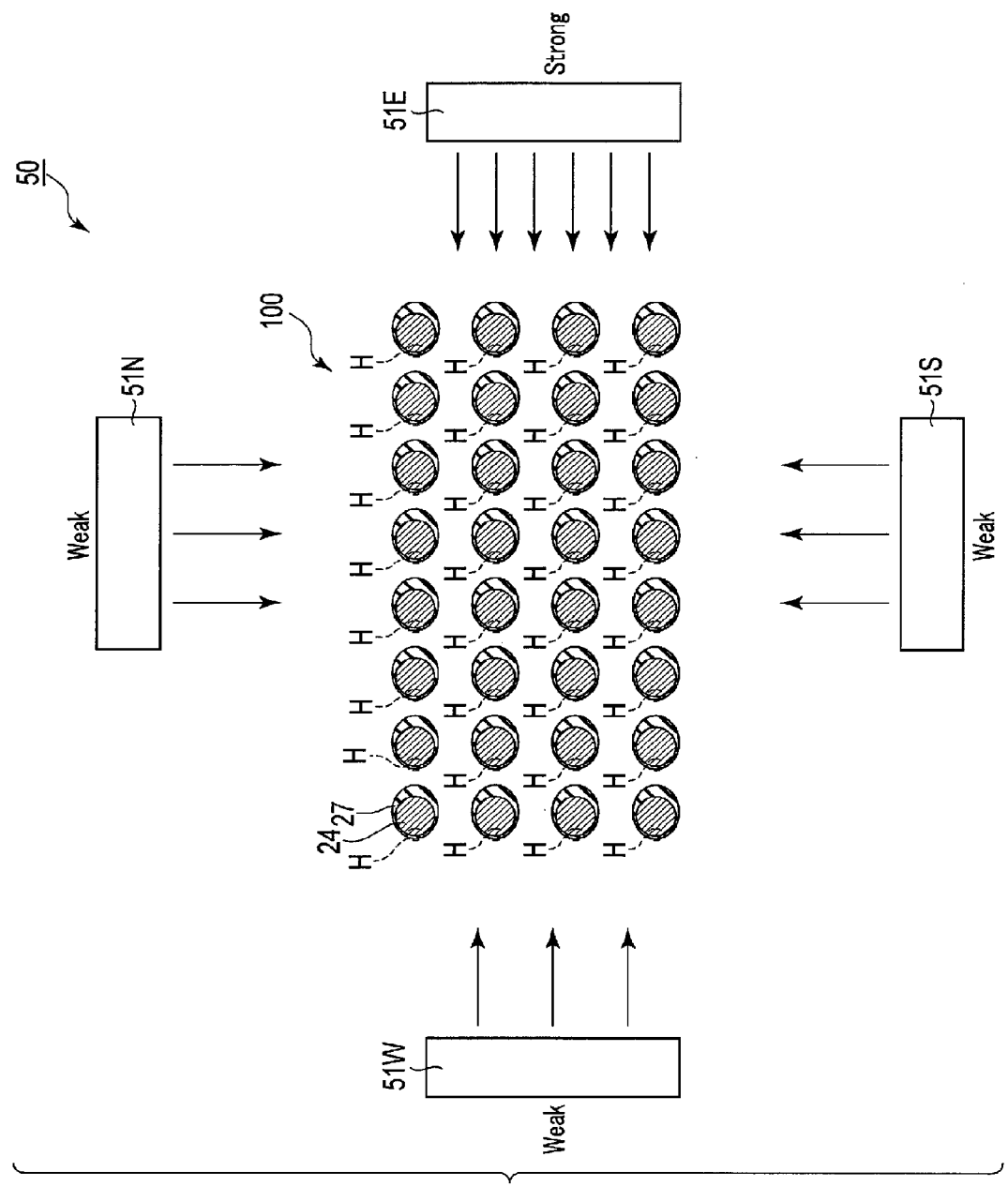
FIG. 11 is a view for describing a forming method (1) of a side-wall insulation film of an MTJ element according to the third embodiment.
Figure 12:
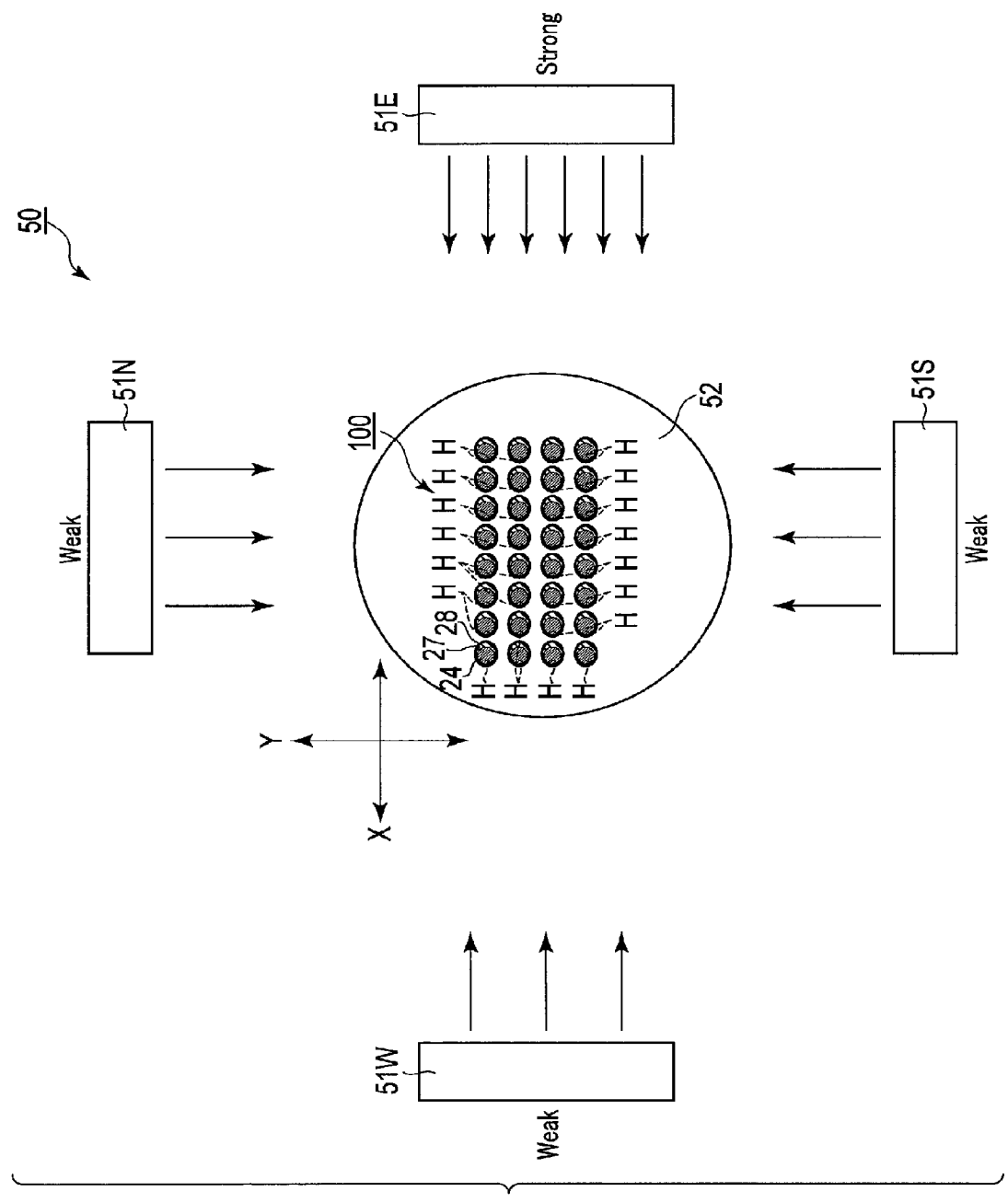
FIG. 12 is a view for describing the forming method (1) of the side-wall insulation film of the MTJ element according to the third embodiment.

Referring to FIG. 11 and FIG. 12, a description is given of the forming method (1) of the side-wall insulation film 27 of the MTJ element 20 according to the third embodiment.

After the multilayer structure 25 of the MTJ element 20 is processed in a cylindrical shape, a wafer is disposed within a film-forming apparatus 50 of the side-wall insulation film 27 as illustrated in FIG. 11. Evaporation sources 51N, 51E, 51S and 51W of the side-wall insulation film 27 are disposed in four directions of the memory cell array 100. Using this film-forming apparatus 50, the side-wall insulation film 27 is formed obliquely with respect to the substrate. Thereby, the side-wall insulation film 27 with few defects can be formed on the side wall of the multilayer structure 25.

In the film forming step, for example, in the evaporation sources 51N, 51E, 51S and 51W which are disposed in the four directions of the memory cell array 100, the density of side-wall film particles, which are generated from the evaporation sources 51N, 51S and 51W, is set to be low, and the density of side-wall film particles, which are generated from the evaporation source 51E, is set to be high. Thereby, the side-wall insulation film 27 on the evaporation source 51W side can be formed to have a small thickness.

In addition, as illustrated in FIG. 12, in order to make uniform the film thickness distribution of the side-wall insulation film 27, the wafer 52 is moved. At this time, by moving the substrate in the X-Y direction (E-W direction, N-S direction), the side-wall insulation film 27 can be formed with the same film thickness distribution around the storage layer 24, while the uniformity within the wafer plane is being maintained.

[6-3] Forming Method (2) of the Side-Wall Insulation Film

In a forming method (2) of the side-wall insulation film 27 of the present embodiment, ion beam etching is used.

Figure 14:
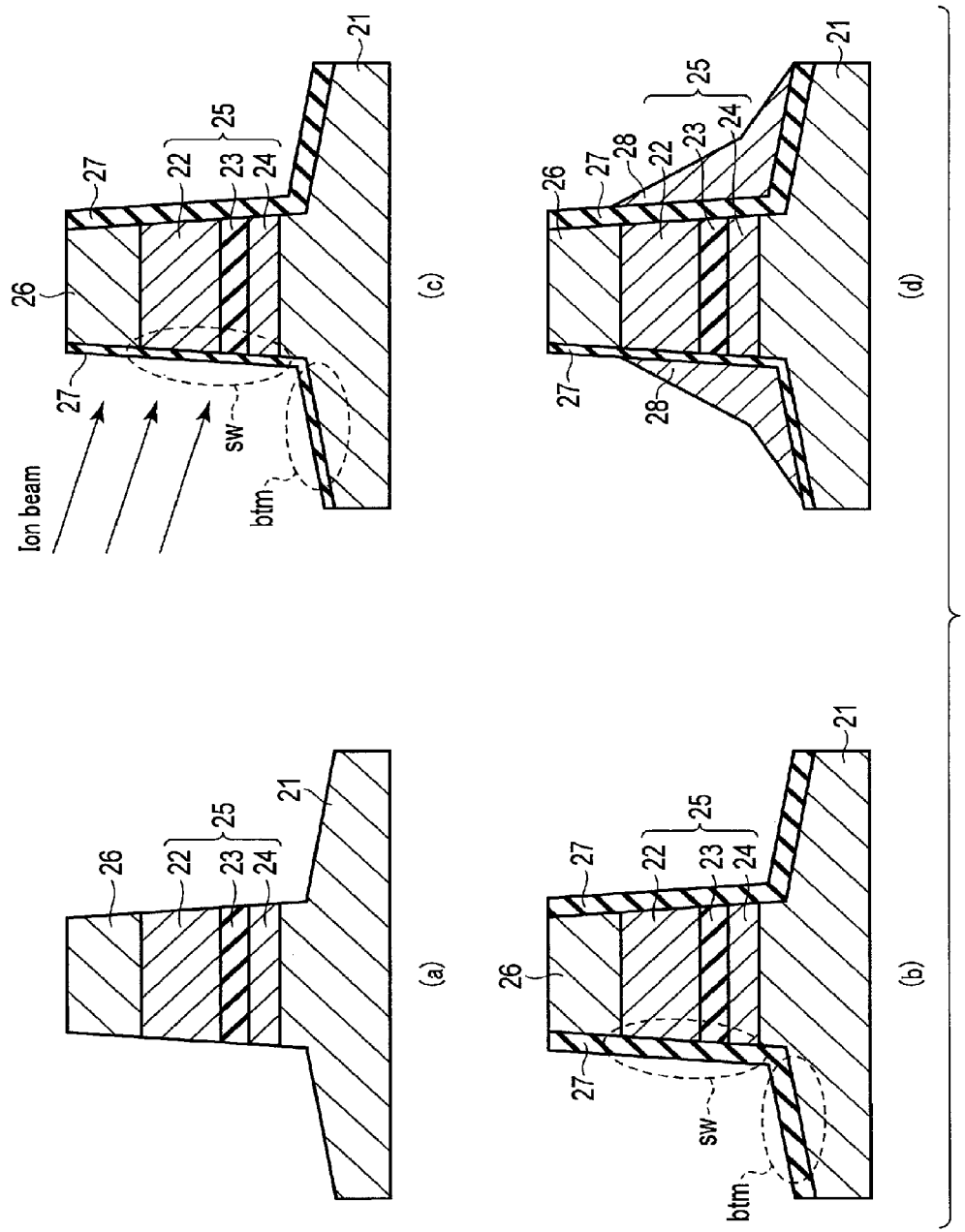
FIG. 14 is a view for describing the forming method (2) of the side-wall insulation film of the MTJ element according to the third embodiment.

Referring to FIG. 13 to FIG. 15, a description is given of the forming method (2) of the side-wall insulation film 27 of the MTJ element 20 according to the third embodiment.

To start with, as illustrated in part (a) of FIG. 13 and part (a) of FIG. 14, the multilayer structure 25, bottom electrode 21 and top electrode 26 of the MTJ element 20 are processed by using an ion beam.

Then, as illustrated in part (b) of FIG. 13 and part (b) of FIG. 14, a side-wall insulation film 27 is uniformly formed around the multilayer structure 25, bottom electrode 21 and top electrode 26 by using MBE. At this time, it is desirable to form the side-wall insulation film 27 so as to have a greater thickness at a bottom portion btm of the multilayer structure 25 than at a side wall portion sw of the multilayer structure 25.

Next, as illustrated in part (c) of FIG. 13 and part (c) of FIG. 14, the side wall portion sw of the side-wall insulation film 27 is mainly etched in a certain direction by using an ion beam, and the thickness of the side-wall insulation film 27 is partly reduced. At this time, by the ion beam etching, not only the side wall portion sw of the side-wall insulation film 27, but also the bottom portion btm of the side-wall insulation film 27 is etched to some degree. However, since the bottom portion btm of the side-wall insulation film 27 is thicker than the side wall portion sw of the side-wall insulation film 27, the bottom electrode 21 is not exposed.

Subsequently, as illustrated in part (d) of FIG. 13 and part (d) of FIG. 14, a metal film, which becomes the control electrode 28, is formed on the side-wall insulation film 27, and this metal film is processed in the shape of the control electrode 28.

In this method (2), the side-wall insulation film 27 is etched by using an ion beam, from only one direction of the side wall of the multilayer structure 25. In this case, as illustrated in FIG. 15, the ion beam is radiated from a certain direction (0 o'clock direction in FIG. 15), and the uniformity in the wafer plane is secured while the wafer 52 is being moved in the X-Y direction.

[6-4] Advantageous Effects

In the third embodiment, in the memory cell array of the magnetic memory, the local high electric field regions H of the MTJ elements 20 are located relatively at the same position. Thereby, at a time of write, a high electric field is applied in a certain direction to all MTJ elements 20 within the memory cell array 100, and magnetic interactions among the MTJ elements 20 become uniform. Thus, the magnetization reversal of the storage layer 24 of each MTJ element 20 tends to easily occur in the same direction. Thereby, the write current can be reduced, and a variance in write current can be suppressed.

[7] Fourth Embodiment

In a fourth embodiment, the control electrode 28 of the MTJ element 20 is described with reference to part (a) of FIG. 16, part (b) of FIG. 16, and FIG. 17.

The control electrode 28 in each embodiment is used in order to apply a voltage, and is not configured to make an electric current to flow to cause energy consumption. Thus, there is no need to reduce the electrical resistance of the control electrode 28. Therefore, the degree of freedom of the shape of the control electrode 28 is high.

For example, as illustrated in part (a) of FIG. 16, the cross-sectional shape of the control electrode 28 may be triangular. In this case, the width of the control electrode 28 can be reduced. Specifically, since the control electrode 28 can be made thin, it is possible to reduce the effect of anisotropy induction by the compressive stress or tensile stress on the multilayer structure 25 by the control electrode 28. Thus, the effect by the high electric field region H becomes easier to occur.

Besides, as illustrated in part (b) of FIG. 16, the cross-sectional shape of the control electrode 28 may be rectangular, if the stress on the multilayer structure 25 by the control electrode 28 can be controlled.

Figure 17:
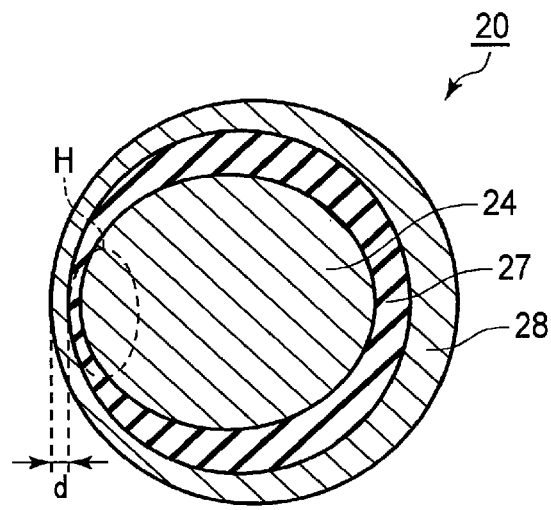
FIG. 17 is a view for describing the control electrode of the MTJ element according to the fourth embodiment.

In addition, as illustrated in FIG. 17, the film thickness of the control electrode 28 may have a distribution. Even if the film thickness of the control electrode 28 has such a distribution, there is practically no problem since an electric field can be applied. If the degree of freedom of the shape of the control electrode 28 is high, a processing design margin increases, and there is a merit in terms of cost. In FIG. 17, a film thickness d of the control electrode 28 in the same region as the region H where the side-wall insulation film 27 is thin may be decreased. Thereby, in the region H, since the compressive stress on the multilayer structure 25 by the control electrode 28 can be controlled, the effect by the high electric field region H can be enhanced.

[8] Fifth Embodiment

Figure 18:
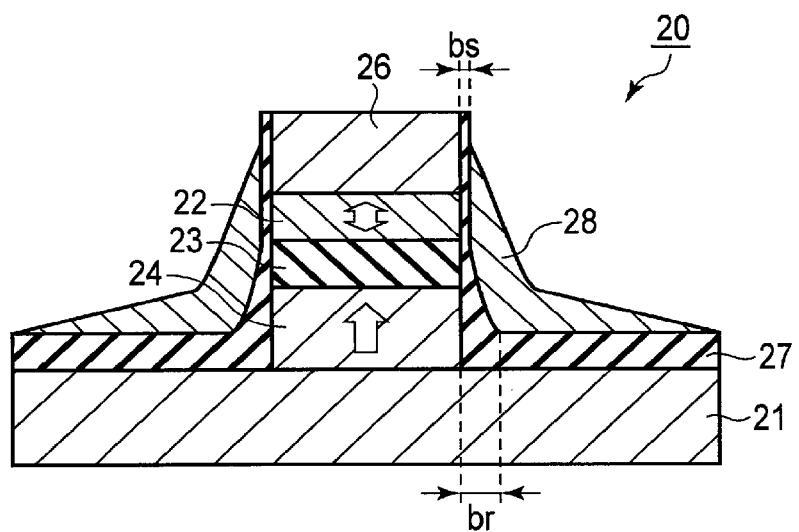
FIG. 18 is a view for describing the film thickness of a side-wall insulation film of an MTJ element according to a fifth embodiment.

Referring to FIG. 18, a description is given of the thickness of a side-wall insulation film 27 of an MTJ element 20 according to a fifth embodiment.

As illustrated in FIG. 18, a thickness bs of the side-wall insulation film 27 on the side surface of the storage layer 22 is less than a thickness br of the side-wall insulation film 27 on the side surface of the reference layer 24.

In the meantime, in the fifth embodiment, like the above-described embodiments, the thickness b of the side-wall insulation film 27 has a film thickness distribution along the periphery of the side surface of the storage layer 24, so that the high electric field region H may locally occur in the storage layer 24. In addition, the electric field intensity of the high electric field region H on the side surface of the storage layer 24 is higher than the electric field intensity of the high electric field region H on the side surface of the reference layer 22. Furthermore, the ratio between the maximum value and minimum value of the thickness b of the side-wall insulation film 27 on the side surface of the storage layer 24 is greater than the ratio between the maximum value and minimum value of the thickness b of the side-wall insulation film 27 on the side surface of the reference layer 22.

As described above, in the fifth embodiment, the thickness bs of the side-wall insulation film 27 on the side surface of the storage layer 24 is set to be less than the thickness br of the side-wall insulation film 27 on the side surface of the reference layer 22. Thereby, the action of the electric field can strongly be exerted on the storage layer 24 to which the voltage is to be properly applied. It is thus possible to suppress a write error, a read error, and a decrease in yield by short-circuit to the control electrode 28 due to a pinhole.

[9] Sixth Embodiment

In a sixth embodiment, a description is given of a case in which the MTJ element of each of the above-described embodiments is applied to a magnetic memory. An example of the magnetic memory is an MRAM.

[9-1] Memory Cell

Figure 19:
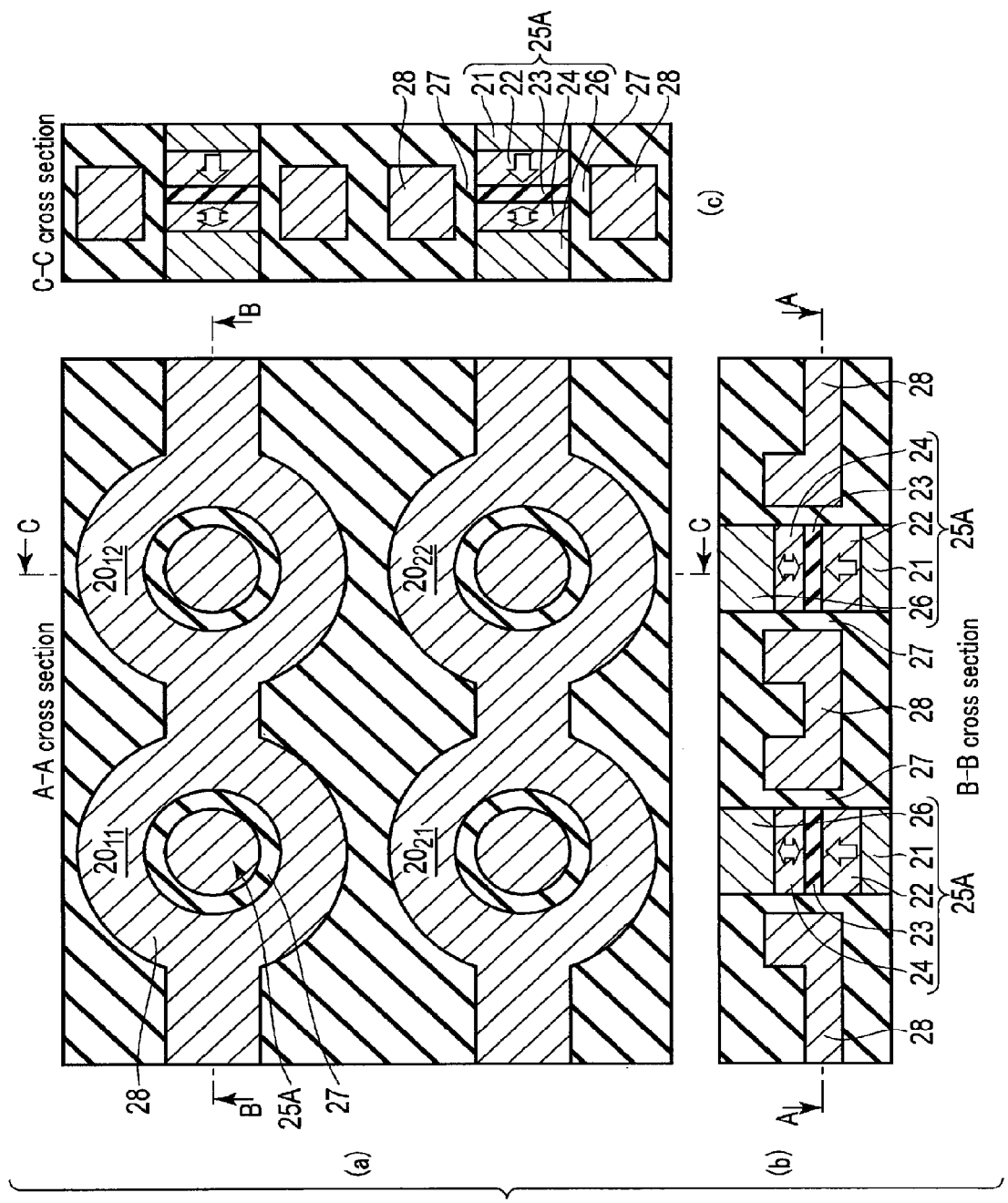
FIG. 19 is a cross-sectional view of memory cells of a magnetic memory according to a sixth embodiment.
Figures 20, 21:
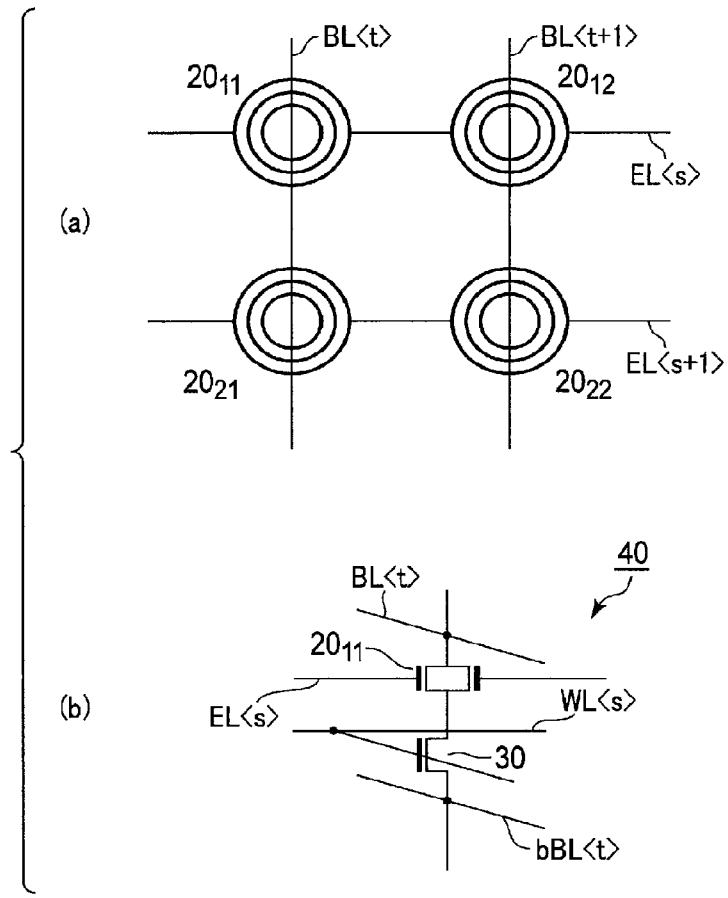
FIG. 20 is a view for describing the memory cells of the magnetic memory according to the sixth embodiment.
FIG. 21 is a view illustrating examples of potentials of bit lines and control lines at times of write and read in the magnetic memory according to the sixth embodiment.

Referring to part (a) of FIG. 19 to part (c) of FIG. 19, part (a) of FIG. 20, and part (b) of FIG. 20, memory cells of the magnetic memory according to the sixth embodiment are described. Part (a) of FIG. 19 is a cross-sectional view taken along line A-A in part (b) of FIG. 19. Part (b) of FIG. 19 is a cross-sectional view taken along line B-B in part (a) of FIG. 19. Part (c) of FIG. 19 is a cross-sectional view taken along line C-C in part (a) of FIG. 19.

As illustrated in part (a) of FIG. 19 to part (c) of FIG. 19, the magnetic memory includes a plurality of memory cells which are arranged in a matrix of, for example, four rows× four columns. The respective memory cells include, as memory elements, MTJ elements $20_{11}$, $20_{12}$, $20_{21}$ and $20_{22}$ which were described in the embodiments. Each MTJ element $20_{ij}$ (i=1, 2, j=1, 2) includes a multilayer structure 25A in which a bottom electrode 21, a fixed layer 22, a tunnel barrier layer 23, a storage layer 24, and a top electrode 26 are stacked in the named order. The periphery of the multilayer structure 25A is covered with a side-wall insulation film 27, and a control electrode 28 is disposed on the outer periphery of the side-wall insulation film 27. In each MTJ element $20_{ij}$ (i=1, 2, j=1, 2), the control electrode 28 is disposed in a manner to surround the side surface of the storage layer 24, with the side-wall insulation film 27 being interposed. In addition, the control electrodes 28 of the MTJ elements arranged on the same row, for example, the MTJ elements $20_{11}$ and $20_{12}$, are electrically connected and serve as a common control line.

As illustrated in part (a) of FIG. 20, bit lines BL<t> and BL<t+1> are connected to the top electrodes 26 of the MTJ elements $20_{11}$ to $20_{22}$. Here, the bit line BL<t> is connected to the top electrodes 26 of the MTJ element $20_{11}$ and MTJ element $20_{21}$. The bit line BL<t+1> is connected to the top electrodes 26 of the MTJ element $20_{12}$ and MTJ element $20_{22}$.

On the other hand, control lines EL<s> and EL<s+1> are disposed in a direction crossing the bit lines. Here, the control line EL<s> is connected to the control electrodes 28 which are disposed on the side surfaces of the MTJ elements $20_{11}$ and $20_{12}$, with the side-wall insulation films 27 interposed. The control line EL<s+1> is connected to the control electrodes 28 which are disposed on the side surfaces of the MTJ elements $20_{21}$ and $20_{22}$, with the side-wall insulation films 27 interposed.

As illustrated in part (b) of FIG. 20, in a memory cell 40 including the MTJ element $20_{11}$, the bottom electrode 21 of the MTJ element $20_{11}$ is connected to one of a source and a drain of a select transistor 30. The other of the source and drain of the select transistor 30 is connected to a bit line bBL<t>. In addition, a word line WL<s> is connected to the gate of the select transistor 30. The word line WL<s> is disposed in parallel to the control line EL<s>. Incidentally, although part (b) of FIG. 20 is a view illustrating, by way of example, the memory cell 40 including the MTJ element $20_{11}$, the other memory cells 40 have the same configuration.

[9-2] Potentials of the Bit Lines and Control Lines

Referring to FIG. 21, a description is given of an example of potential setting of bit lines and control lines at a time of selecting the MTJ element $20_{11}$ illustrated in part (a) of FIG. 20 and executing read and write. Here, as an example of the potential setting, it is assumed that the bit line potential at a time of write is 0.5 V, and the bit line potential at a time of read is 0.3 V.

As described above, there is a method in which the energy barrier is increased and the direction of magnetization of the storage layer 24 is stabilized by applying a voltage between the storage layer 24 and control electrode 28. As regards the application voltage in this method, the following two cases can be thought. In a first case, like a magnetic layer of CoFeB or the like, the potential of the control electrode 28 is set to be higher than the potential of the storage layer 24. In a second case, like a magnetic layer of FePd, the potential of the control electrode 28 is set to be lower than the potential of the storage layer 24. The setting of potentials is different between the first case and the second case. The two cases will individually be described below.

To begin with, a description is given of the case (first case) in which, like a magnetic layer of CoFeB or the like, the potential of the control electrode 28 is set to be higher than the potential of the storage layer 24.

At a time of write, the control line EL<s+1> is set at a high potential (e.g. 1.5 V), and the magnetization of the storage layer 24 of the connected MTJ element is stabilized. On the other hand, the control line EL<s>, to which the selected cell is connected, is set at a potential which is substantially equal to, or lower than, the potential (e.g. 0.5 V) of the storage layer 24 of the MTJ element $20_{11}$ to which write is executed. Thereby, it is possible to prevent an increase in write current due to an increase of the energy barrier of the storage layer 24 of the MTJ element $20_{11}$. In the state in which this setting has been made, a pulse voltage is applied to the bit line BL<t>, and write is executed to the MTJ element $20_{11}$. During this time, the potential of the bit line BL<t+1> is fixed at 0 V. Thereby, the MTJ element $20_{12}$ is also kept in the state in which the potential of the control electrode 28 is higher than the potential of the storage layer 24, and erroneous write can be prevented.

At a time of read, both the control line EL<s> and the control line EL<s+1> are set at a high potential (e.g. 1.5 V). In this state, a read pulse potential is applied to the bit line BL<t>, and the magnetization state of the storage layer 24 of the MTJ element $20_{11}$ is sensed by a sense amplifier. During this time, the potential of the bit line BL<t+1> is fixed at 0 V.

Next, a description is given of the case (second case) in which, like a magnetic layer of FePd, the potential of the control electrode 28 is set to be lower than the potential of the storage layer 24.

At a time of write, the control line EL<s+1> is set at 0 V, and erroneous write to an unselected cell is prevented. The control line EL<s> is set at a potential which is equal to, or higher than, the potential (e.g. 0.5 V) of the storage layer 24 of the memory cell to which write is executed, and an increase in reversal current is prevented. In this state, a write voltage pulse (e.g. 0.5 V) is applied to the bit line BL<t>, and write is executed. During this time, the bit line BL<t+1> is kept at a high potential (e.g. 1.5 V).

At a time of read, both the control line EL<s> and the control line EL<s+1> are set at 0 V. A read voltage (e.g. 0.3 V) is applied to the bit line BL<t>, and the magnetization state of the MTJ element $20_{11}$ is sensed by the sense amplifier. By this operation, read disturb can be avoided. During this time, the bit line BL<t+1> is kept at a high potential (e.g. 1.5 V).

In the meantime, in the above description, the voltage that is necessary at a time of write is different between the write at a time of setting the magnetization of the storage layer in the MTJ element in a parallel state relative to the magnetization of the reference layer, and the write at a time of setting the magnetization of the storage layer in the MTJ element in an antiparallel state relative to the magnetization of the reference layer. However, only an example is illustrated for the purpose of simple description, and a detailed description is omitted. Specifically, in this example, write for setting a parallel state is executed to an MTJ element in which a storage layer is located on a side opposite to a select transistor with respect to a reference layer. In fact, potentials of respective bit lines and control lines are adjusted in accordance with conditions of write and read.

[9-3] Magnetic Memory

Figure 22:
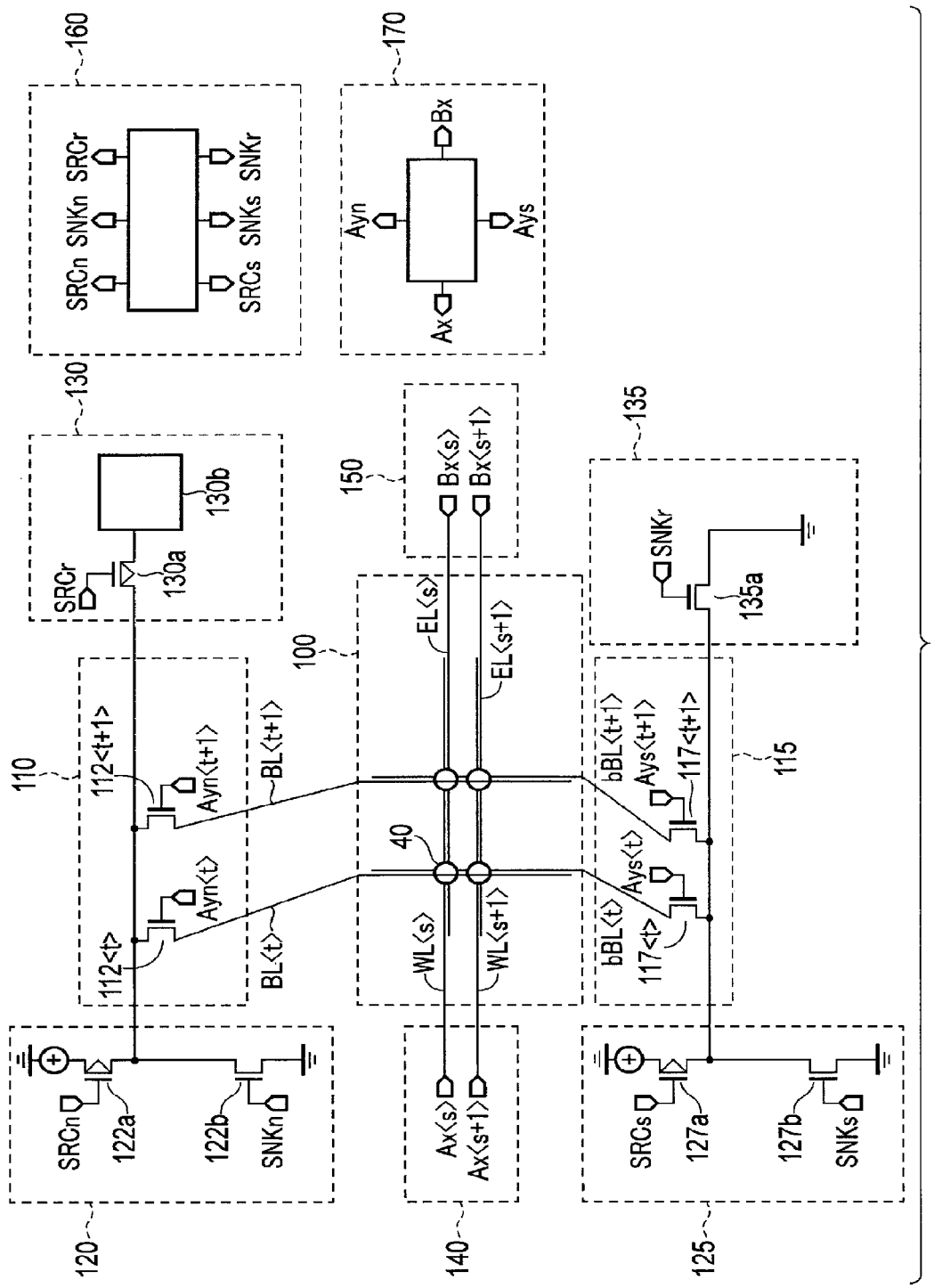
FIG. 22 is a circuit diagram of the magnetic memory according to the sixth embodiment.

Referring to FIG. 22, the configuration of the magnetic memory according to the sixth embodiment is described.

As illustrated in FIG. 22, memory cells 40 in a memory cell array 100 are connected to first bit lines (conductive lines) BL<t> and BL<t+1>, second bit lines (conductive lines) bBL<t> and bBL<t+1>, word lines (conductive lines) WL<s> and WL<s+1>, and control lines (conductive lines) EL<s> and EL<s+1>. Incidentally, the memory cells 40 are the same as the memory cell 40 shown in part (b) of FIG. 20.

The first bit lines BL<t> and BL<t+1> are connected to a write circuit 120 and a read circuit 130 via a bit line select circuit 110. The bit line select circuit 110 includes switch elements (FET) 112<t> and 112<t+1> which are ON/OFF controlled by control signals Ayn<t> and Ayn<t+1>.

The write circuit 120 includes switch elements (FET) 122a and 122b which are ON/OFF controlled by control signals SRCn and SNKn.

The read circuit 130 includes a switch element (FET) 130a which is ON/OFF controlled by a control signal SRCr, and a sense amplifier 130b.

The second bit lines bBL<t> and bBL<t+1> are connected to a write circuit 125 and a read circuit 135 via a bit line select circuit 115. The bit line select circuit 115 includes switch elements (FET) 117<t> and 117<t+1> which are ON/OFF controlled by control signals Ays<t> and Ays<t+1>.

The write circuit 125 includes switch elements (FET) 127a and 127b which are ON/OFF controlled by control signals SRCs and SNKs.

The read circuit 135 includes a switch element (FET) 135a which is ON/OFF controlled by a control signal SNKr.

The word lines WL<s> and WL<s+1> are connected to a word line select circuit 140. The word line select circuit 140 drives the word lines WL<s> and WL<s+1> by control signals Ax<s> and Ax<s+1>.

The control lines EL<s> and EL<s+1> are connected to a control line select circuit 150. The control line select circuit 150 drives the control lines EL<s> and EL<s+1> by control signals Bx<s> and Bx<s+1>.

A control circuit 160 generates the control signals SRCn, SNKn, SRCs, SNKs, SRCr and SNKr.

A decoder 170 generates control signals Ayn, Ays, Ax and Bx. It should be noted, however, that the control signals Ayn, Ays, Ax and Bx comprehensively represent all corresponding control signals.

As has been described above, according to the embodiments, in the write operation, the energy barrier, which is necessary for reversal of magnetization of the storage layer 24, can be controlled with high efficiency. Thereby, the write current can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising a memory cell array in which magnetic memory elements are disposed in an array, each of the magnetic memory elements comprising:
    a first magnetic layer;
    a second magnetic layer;
    a nonmagnetic layer disposed between the first magnetic layer and the second magnetic layer;
    an electrode disposed on a side surface of the first magnetic layer; and
    a first insulation layer disposed between the first magnetic layer and the electrode,
    wherein the magnetic memory elements in the memory cell array comprise a first magnetic memory element and a second magnetic memory element,
    a dielectric constant at a first position in the first magnetic memory element is higher than a dielectric constant at a second position in the first magnetic memory element, and a dielectric constant at a third position in the second magnetic memory element is higher than a dielectric constant at a fourth position in the second magnetic memory element, when an electric field occurs by applying a voltage between the first magnetic layer and the electrode,
    the first position is a position of crossing between the first insulation layer and a line segment having a first angle to a straight line connecting a first center point of the first magnetic memory element and a second center point of the second magnetic memory element, the line segment connecting the first center point and a first peripheral portion of the first magnetic memory element,
    the second position is a position of crossing between the first insulation layer and a line segment having a second angle to the straight line, which is different from the first angle, and connecting the first center point and a second peripheral portion of the first magnetic memory element, the third position is a position of crossing between the first insulation layer and a line segment having the first angle to the straight line, and connecting the second center point and a third peripheral portion of the second magnetic memory element, and the fourth position is a position of crossing between the first insulation layer and a line segment having the second angle to the straight line, and connecting the second center point and a fourth peripheral portion of the second magnetic memory element.

2. The element of claim 1, wherein the first insulation layer comprises at least one selected from the group consisting of an oxide, a nitride and a fluoride, each of which comprises at least one selected from the group consisting of silicon, aluminum, magnesium, hafnium, cerium, strontium, tantalum and titanium.

3. The element of claim 1, wherein the first insulation layer comprises at least one selected from the group consisting of $SrRuO_3$, $SrIrO_3$, $BaTiO_3$, and $StTiO_3$, magnesium oxide, aluminum oxide, aluminum nitride, silicon oxide, and silicon nitride.

4. The element of claim 1, wherein the first insulation layer is disposed on a side surface of the second magnetic layer, and a film thickness of the first insulation layer at the first magnetic layer is less than a film thickness of the first insulation layer at the second magnetic layer.

5. A magnetic memory comprising a memory cell array in which magnetic memory elements are disposed in an array, each of the magnetic memory elements comprising:

a first magnetic layer;

a second magnetic layer;

a nonmagnetic layer disposed between the first magnetic layer and the second magnetic layer;

an electrode disposed on a side surface of the first magnetic layer; and a first insulation layer disposed between the first magnetic layer and the electrode, wherein the magnetic memory elements in the memory cell array comprise a first magnetic memory element and a second magnetic memory element, a film thickness at a first position in the first insulation layer of the first magnetic memory element is less than a film thickness at a second position in the first insulation layer of the first magnetic memory element, and a film thickness at a third position in the first insulation layer of the second magnetic memory element is less than a film thickness at a fourth position in the first insulation layer of the second magnetic memory element, the first position is a position of crossing between the first insulation layer and a line segment having a first angle to a straight line connecting a first center point of the first magnetic memory element and a second center point of the second magnetic memory element, the line segment connecting the first center point and a first peripheral portion of the first magnetic memory element, the second position is a position of crossing between the first insulation layer and a line segment having a second angle to the straight line, which is different from the first angle, and connecting the first center point and a second peripheral portion of the first magnetic memory element, the third position is a position of crossing between the first insulation layer and a line segment having the first angle to the straight line, and connecting the second center point and a third peripheral portion of the second magnetic memory element, and the fourth position is a position of crossing between the first insulation layer and a line segment having the second angle to the straight line, and connecting the second center point and a fourth peripheral portion of the second magnetic memory element.

6. The element of claim 5, wherein the first insulation layer comprises at least one selected from the group consisting of an oxide, a nitride and a fluoride, each of which comprises at least one selected from the group consisting of silicon, aluminum, magnesium, hafnium, cerium, strontium, tantalum and titanium.

7. The element of claim 5, wherein the first insulation layer comprises at least one selected from the group consisting of $SrRuO_3$, $SrIrO_3$, $BaTiO_3$, and $StTiO_3$, magnesium oxide, aluminum oxide, aluminum nitride, silicon oxide, and silicon nitride.

8. The element of claim 5, wherein the first insulation layer is disposed on a side surface of the second magnetic layer, and a film thickness of the first insulation layer at the first magnetic layer is less than a film thickness of the first insulation layer at the second magnetic layer.

* * * * *